US012658664B2

(12) United States Patent (10) Patent No.: US 12,658,664 B2
Yamamoto et al. (45) Date of Patent: Jun. 16, 2026

(54) GAS LASER AMPLIFIER, GAS LASER APPARATUS, EUV LIGHT GENERATION APPARATUS, AND EUV EXPOSURE APPARATUS

(71) Applicant: Mitsubishi Electric Corporation, Tokyo (JP)

(72) Inventors: Tatsuya Yamamoto, Tokyo (JP); Junichi Nishimae, Tokyo (JP); Yuzuru Tadokoro, Tokyo (JP); Masashi Naruse, Tokyo (JP); Takuya Kawashima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 1042 days.

(21) Appl. No.: 17/767,920

(22) PCT Filed: Nov. 11, 2019

(86) PCT No.: PCT/JP2019/044152
§ 371 (c)(1),
(2) Date: Apr. 11, 2022

(87) PCT Pub. No.: WO2021/095099
PCT Pub. Date: May 20, 2021

(65) Prior Publication Data
US 2024/0128705 A1 Apr. 18, 2024

(51) Int. Cl.
*H01S 3/00* (2006.01)
*G03F 7/00* (2006.01)
(Continued)

(52) U.S. Cl.
CPC ...... *H01S 3/10061* (2013.01); *G03F 7/70025* (2013.01); *H01S 3/036* (2013.01);
(Continued)

(58) Field of Classification Search
CPC .... H01S 3/10061; H01S 3/036; H01S 3/0816; H01S 3/2232; H01S 2302/00; G03F 7/70025; G03F 7/0025
See application file for complete search history.

(56) References Cited

U.S. PATENT DOCUMENTS

| | | | |
|---|---|---|---|
| 7,876,498 B1 | 1/2011 | Honea et al. | |
| 7,903,715 B2 | 3/2011 | Nowak et al. | |
| (Continued) | | | |

FOREIGN PATENT DOCUMENTS

| | | | |
|---|---|---|---|
| JP | 2010-21518 A | 1/2010 | |
| JP | 2015-103762 A | 6/2015 | |
| (Continued) | | | |

OTHER PUBLICATIONS

Office Action received for German Patent Application No. 112019007885.2, mailed on Mar. 25, 2024, 11 pages.
(Continued)

*Primary Examiner* — Mark Hellner
(74) *Attorney, Agent, or Firm* — XSENSUS LLP

(57) ABSTRACT

A gas laser amplifier includes a housing, discharge electrode pairs, and an optical resonator. The housing includes an entrance window that allows entry of a first laser beam from outside and an exit window that allows exit of the first laser beam amplified. Each of the discharge electrode pairs excites a laser gas supplied between discharge electrodes facing each other in the housing. The optical resonator causes a second laser beam to oscillate with a gain of the excited laser gas in a non-incident state where the first laser beam from outside the housing does not enter the housing through the entrance window. In an incident state where the first laser beam enters the housing through the entrance window, the optical resonator suspends the oscillation of the second laser beam.

18 Claims, 24 Drawing Sheets

(51) Int. Cl.

| | |
|---|---|
| *H01S 3/036* | (2006.01) |
| *H01S 3/081* | (2006.01) |
| *H01S 3/10* | (2006.01) |
| *H01S 3/223* | (2006.01) |

(52) U.S. Cl.
CPC .......... *H01S 3/0816* (2013.01); *H01S 3/2232* (2013.01); *H01S 2302/00* (2013.01)

(56) References Cited

U.S. PATENT DOCUMENTS

| | | | |
|---|---|---|---|
| 9,059,567 B2 | 6/2015 | Tanino et al. | |
| 9,515,446 B2 | 12/2016 | Tanino et al. | |
| 9,680,277 B2 | 6/2017 | Nowak et al. | |
| 2016/0172814 A1 * | 6/2016 | Suganuma | H01S 3/038 |
| | | | 359/345 |

FOREIGN PATENT DOCUMENTS

| | | | | |
|---|---|---|---|---|
| WO | WO 2013017338 A1 * | 2/2013 | | H01S 5/142 |
| WO | 2013/084608 A1 | 6/2013 | | |

| | | |
|---|---|---|
| WO | 2014/045889 A1 | 3/2014 |
| WO | 2015/008405 A1 | 1/2015 |
| WO | 2020/234944 A1 | 11/2020 |

OTHER PUBLICATIONS

Office Action issued Aug. 7, 2024 in German Patent Application No. 112019007885.2 with English translation thereof.

International Search Report and Written Opinion mailed on Feb. 4, 2020, received for PCT Application PCT/JP2019/044152, Filed on Nov. 11, 2019, 8 pages including English Translation.

Office Action mailed on Jun. 26, 2025 for the corresponding German patent application No. 112019007885.2 with an English machine translation thereof, 5pp.

The Office Action issued on Sep. 16, 2025 for the corresponding German patent application No. 11 2019 007 885.2, 16 pages.

* cited by examiner

GAS LASER AMPLIFIER, GAS LASER APPARATUS, EUV LIGHT GENERATION APPARATUS, AND EUV EXPOSURE APPARATUS

CROSS-REFERENCE TO RELATED APPLICATION

The present application is based on PCT filing PCT/JP2019/044152, filed Nov. 11, 2019, the entire contents of which are incorporated herein by reference.

FIELD

The present invention relates to a gas laser amplifier that use a gas as a laser medium to generate or amplify a laser beam, a gas laser apparatus, an extreme ultraviolet (EUV) light generation apparatus, and an EUV exposure apparatus.

BACKGROUND

An EUV light generation apparatus includes a gas laser amplifier that generates a laser beam and an EUV light generation unit that irradiates a target with the laser beam emitted from the gas laser amplifier to generate EUV light. The gas laser amplifier includes a chamber accommodating a gas laser gain medium that is a laser gas containing $CO_2$ gas, a first window provided at a first face of the chamber, and a second window provided at a second face of the chamber facing the first face. The gas laser amplifier further includes a pair of plate electrodes that face each other for application of a voltage across a space between a first concave mirror and a second concave mirror. When the high-frequency voltage is applied between the plate electrodes of the gas laser amplifier, a discharge region is formed, and the laser gas is excited. With the laser gas in this state, a seed laser beam enters the chamber through the first window and passes through the discharge region, such that the seed laser beam is amplified into an amplified beam. The amplified beam undergoes repeated reflections between the second concave mirror and the first concave mirror. After the predetermined number of reflections, the amplified beam from the first concave mirror is output from the chamber through the second window.

In the gas laser amplifier, spontaneous emission light generated in the discharge region undergoes reflections between the first window and the second window, thus resulting in self-oscillation. In view of this, a gas laser amplifier disclosed in Patent Literature 1 includes apertures each having an opening on an optical axis designed in the gas laser amplifier. Self-oscillating light generated within the gas laser amplifier is blocked by these apertures, so that emission of the self-oscillating light through a first and a second window is restrained.

CITATION LIST

Patent Literature

Patent Literature 1: PCT International Publication No. 2014/045889

SUMMARY

Technical Problem

The above-described conventional gas laser amplifier is capable of preventing self-oscillating light generated on an optical axis different from that of a seed laser beam from exiting through the first and second windows. Unfortunately, the conventional gas laser amplifier fails to prevent self-oscillating light generated substantially on the same optical axis as the seed laser beam from exiting the amplifier. The apertures of the gas laser amplifier described in Patent Literature 1 are provided at the first window and the second window, respectively. The aperture at the first window and the aperture at the second window form a to-and-fro optical path, so that the optical axis on which the self-oscillating light oscillates substantially coincides with that of the seed laser beam in the gas laser amplifier. Even if the apertures have low reflectances to laser beams, there is a possibility that a slight amount of scattered light will result in self-oscillation between the apertures at the first and second windows when the gas laser amplifier has a larger gain. A problem with the gas laser amplifier of the above-described EUV light generation apparatus is that when self-oscillating light is generated substantially on the same optical axis as the seed laser beam, the target in the EUV light generation unit is irradiated with the self-oscillating light at an unintended timing, which is a cause of failure of the EUV light generation apparatus.

The present invention has been made in view of the above, and an object of the present invention is to obtain a gas laser amplifier that is capable of preventing generation of self-oscillating light on the same optical axis as a seed laser beam.

Solution to Problem

In order to solve the above-mentioned problem and achieve the object, a gas laser amplifier according to the present invention comprises a housing, a discharge electrode pair, and an optical resonator. The housing includes an entrance window to allow entry of a first laser beam from outside, and an exit window to allow exit of the first laser beam amplified. The discharge electrode pair excites a laser gas supplied between discharge electrodes facing each other in the housing. The optical resonator causes a second laser beam to oscillate with a gain of the excited laser gas in a non-incident state where the first laser beam from outside the housing does not enter the housing through the entrance window, and suspends the oscillation of the second laser beam in an incident state where the first laser beam enters the housing through the entrance window.

Advantageous Effects of Invention

The gas laser amplifier according to the present invention is capable of preventing generation of self-oscillating light on the same optical axis as the seed laser beam.

BRIEF DESCRIPTION OF DRAWINGS

FIG. 10 illustrates an example of how a gain within the gas laser amplifier according to the first embodiment varies with time.

FIG. 11 illustrates an example of how an output of the laser beam amplified by the gas laser amplifier according to the first embodiment varies with time.

FIG. 17 illustrates an example of how a gain within the gas laser amplifier according to the second embodiment varies with time.

FIG. 31 illustrates an example of how a gain within the second-stage gas laser amplifier according to the seventh embodiment varies with time.

DESCRIPTION OF EMBODIMENTS

With reference to the drawings, a detailed description is hereinafter provided of gas laser amplifiers, gas laser apparatuses, an EUV light generation apparatus, and an EUV exposure apparatus according to embodiments of the present invention. It is to be noted that these embodiments are not restrictive of the present invention.

First Embodiment

Figure 1:
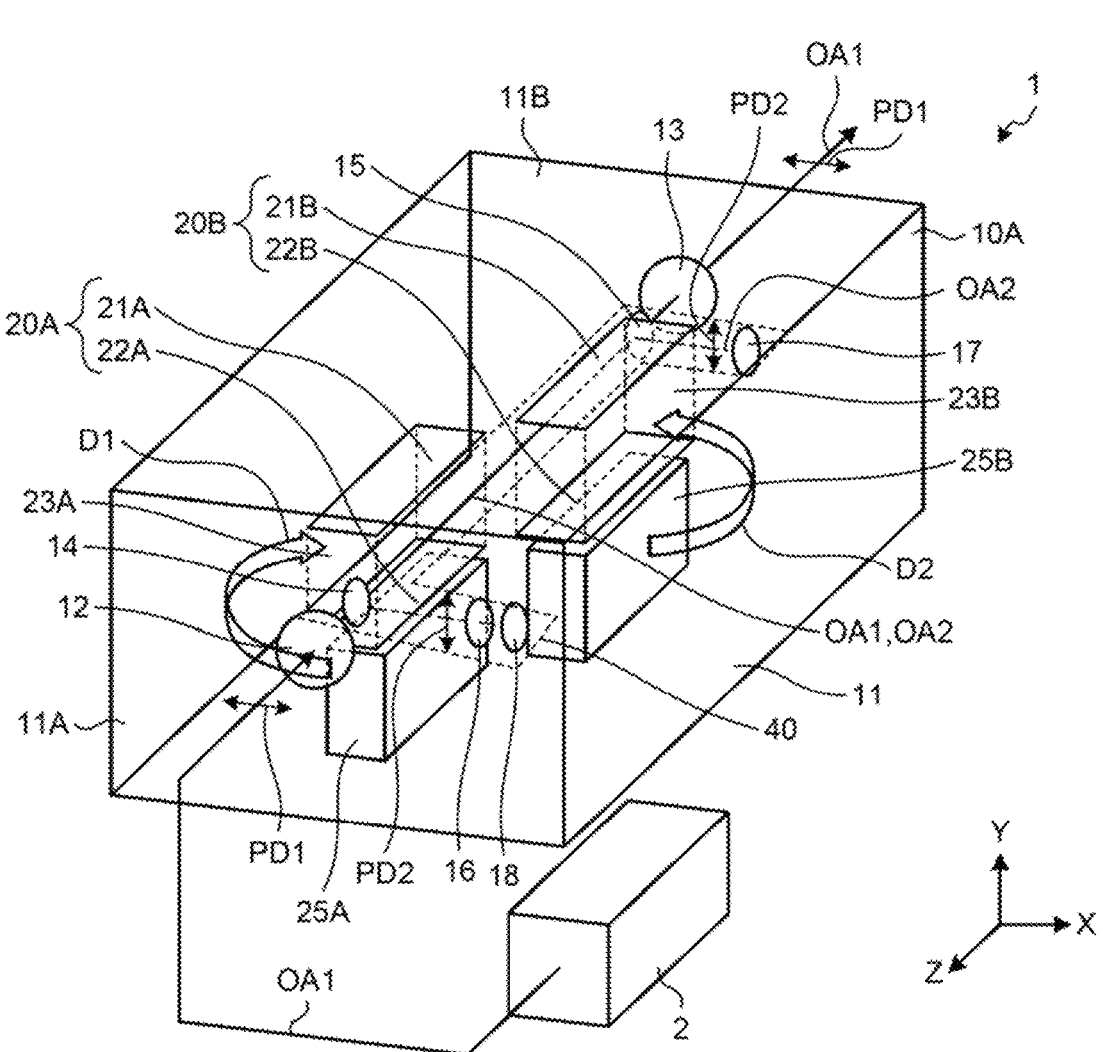
FIG. 1 is a perspective view schematically illustrating a configuration example of a gas laser apparatus that includes a gas laser amplifier according to a first embodiment.
Figure 2:
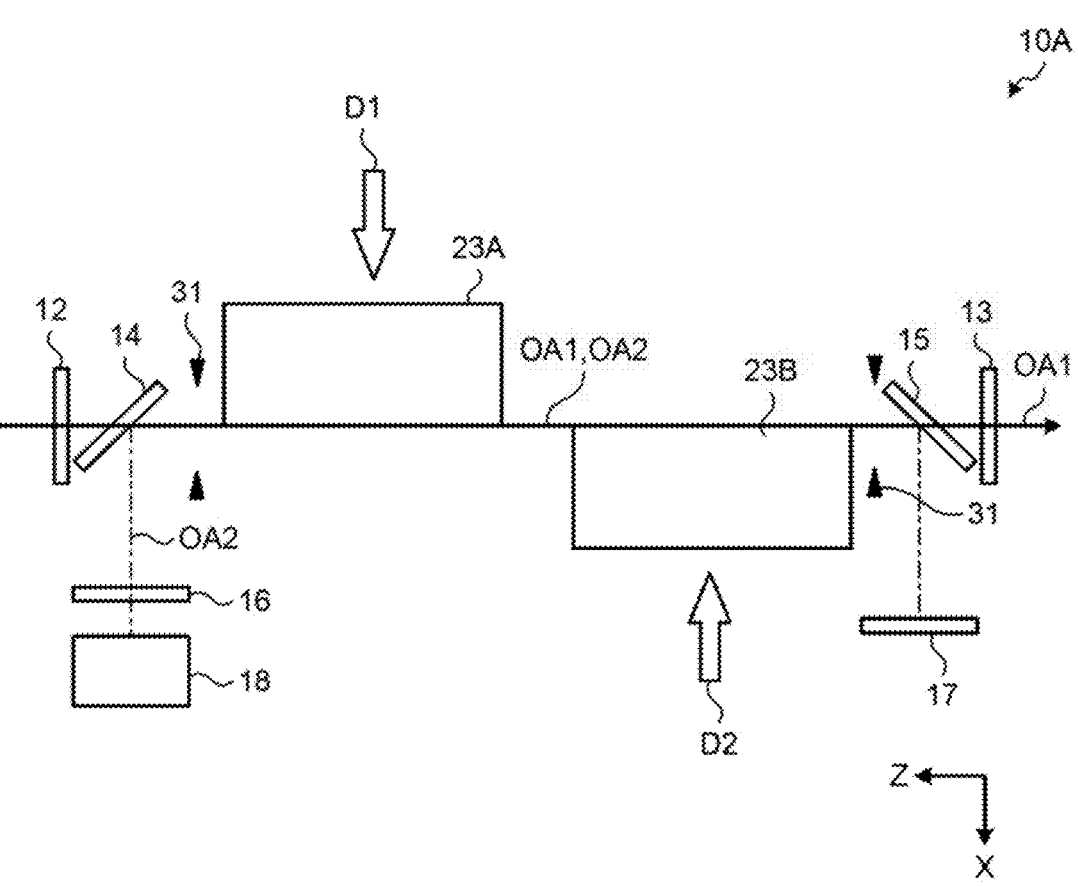
FIG. 2 illustrates an interior of the gas laser amplifier of FIG. 1 as viewed in a Y-direction.

FIG. 1 is a perspective view schematically illustrating a configuration example of a gas laser apparatus that includes a gas laser amplifier according to the first embodiment. In FIG. 1, directions of an optical axis OA1 of a seed laser beam within the gas laser amplifier 10A are Z-directions, and directions of flow of laser gas within the gas laser amplifier 10A are X-directions perpendicular to the Z-directions. Y-directions are perpendicular to the Z-directions and the X-directions. The X-directions, the Y-directions, and the Z-directions are taken the same way in the subsequent drawings. FIG. 2 illustrates an interior of the gas laser amplifier of FIG. 1 as viewed in the Y-direction.

The gas laser apparatus 1 includes a laser beam source 2 and the gas laser amplifier 10A. The laser beam source 2 emits the seed laser beam, that is to say, a laser beam to be amplified. The gas laser amplifier 10A amplifies the seed laser beam and emits the amplified seed laser beam as an amplified beam.

The seed laser beam that the laser beam source 2 outputs is a first laser beam that is linearly polarized. The seed laser beam is a pulsed laser beam having a repetition frequency ranging from several tens of kHz to several hundreds of kHz or a continuous-wave laser beam. In the example of FIG. 1, the seed laser beam is a p-polarized beam having a polarization direction PD1 that is the x-directions.

The gas laser amplifier 10A includes a housing 11 serving to contain a laser gas that is a laser medium. The gas laser amplifier 10A includes a window 12 at a side face 11A of the housing 11 and a window 13 at a side face 11B opposite to the side face 11A. The window 12 allows the seed laser beam from the laser beam source 2 to enter the gas laser amplifier 10A. The window 13 allows the amplified beam, which is emplified in the housing 11, to exit the gas laser amplifier 10A. The windows 12 and 13 are disposed on the same straight line parallel to the Z directions. In other words, the optical axis OA1, through which the windows 12 and 13 are connected to each other inside the housing 11, is the straight line parallel to the Z directions. The window 12 corresponds to an entrance window, and the window 13 corresponds to an exit window.

The gas laser amplifier 10A includes polarizing mirrors 14 and 15, a partially reflective mirror 16, a totally reflective mirror 17, and a damper 13. The polarizing mirrors 14 and 15 are disposed on the optical axis OA1 between the windows 12 and 13 inside the housing 11. The polarizing mirrors 14 and 15 transmit the seed laser beam and the amplified beam having the same polarization direction PD1 as the seed laser beam, but reflect a laser beam having a polarization direction PD2 orthogonal to the polarization direction PD1 of the seed laser beam. In other words, the polarizing mirrors 14 and 15 transmit the p-polarized beam but reflect an s-polarized beam in the X-direction. As a result, the s-polarized beam, which is propagated along the optical axis OA1, is reflected in the X-direction by the polarizing mirrors 14 and 15.

The partially reflective mirror 16 transmits a portion of the laser beam reflected by the polarizing mirror 14, but reflects the remaining portion of the laser beam reflected by the polarizing mirror 14. The totally reflective mirror 17 reflects the laser beam reflected by the polarizing mirror 15. The partially reflective mirror 16 and the totally reflective mirror 17 define an optical resonator 40. The laser beam generated within this optical resonator 40, that is to say, the laser beam that is not the amplified seed laser beam (amplified beam) is amplified by reciprocating between the partially reflective mirror 16 and the totally reflective mirror 17. An optical axis OA2, through which the partially reflective mirror 16 and the totally reflective mirror 17 are connected to each other, is an optical axis of the optical resonator 40.

The damper 18 is disposed behind the partially reflective mirror 16 on the optical axis OA2 and absorbs the laser beam having passed through the partially reflective mirror 16. The laser beam that oscillates within the optical resonator 40, which is polarized to the polarization direction PD2, is reflected by each of the polarizing mirrors 14 and 15. The polarization direction PD2 of the laser beam oscillating within the optical resonator 40 is orthogonal to the polarization direction PD1 of the seed laser beam. The laser beam that oscillates within the optical resonator 40 is therefore reflected by the polarizing mirrors 14 and 15 and is not emitted through the windows 12 and 13. Moreover, the portion of the laser beam that has been transmitted by the partially reflective mirror 16 is absorbed by the damper 18.

The gas laser amplifier 10A includes, in the housing 11, two discharge electrode pairs 20A and 20B that excite the laser gas. The discharge electrode pair 20A includes discharge electrodes 21A and 22A, and the discharge electrode pair 20B includes discharge electrodes 21B and 22B. The discharge electrodes 21A and 22A that make up the discharge electrode pair 20A are spaced apart in the Y-direction with their electrode faces disposed in parallel to each other. The discharge electrodes 213 and 22B that make up the discharge electrode pair 20B are spaced apart in the Y-direction with their respective electrode faces disposed in parallel to each other. In the example of FIGS. 1 and 2, the discharge electrodes 21A and 22A are in an area that extends in the Z-direction between a middle of the housing 11 and the window 12. The discharge electrodes 21B and 22B are in an area that extends in the Z-direction between the middle of the housing 11 and the window 13. The gas laser amplifier 10A further includes a high-frequency power supply (not illustrated) connected to the discharge electrodes 21A and 22A and the discharge electrodes 218 and 22B.

The gas laser amplifier 10A further includes gas flow generation units 25A and 25B. Although not illustrated, each of the gas flow generation units 25A and 25B includes a laser gas supply unit, a blower, and a heat exchanger. The laser gas supply unit supplies the laser gas. The blower causes the laser gas supplied into the housing 11 to flow in the X-direction and circulates the laser gas within the housing 11. The heat exchanger cools the laser gas that has crossed the optical axes OA1 and OA2. The gas flow generation units 25A and 25B cause the laser gases to flow in the opposite X-directions at different positions separate from each other in the Z-direction. In other words, in the example of FIG. 1, the gas flow generation unit 25A is disposed under the discharge electrode 22A, while the gas flow generation unit 25B is disposed under the discharge electrode 22B. Specifically, the laser gas supply unit of the gas flow generation unit 25A supplies the laser gas in a direction D1 so that the laser gas flows between the discharge electrodes 21A and 22A in the positive X-direction. The laser gas supply unit of the gas flow generation unit 25B supplies the laser gas in a direction D2 so that the laser gas flows between the discharge electrodes 218 and 22B in the negative X-direction. $CO_2$ gas is usable as the laser gas. When using the $CO_2$ gas as the laser gas, the gas laser amplifier 10A is usable as a light source of an EUV exposure apparatus.

When a high-frequency voltage is applied between the discharge electrodes 21A and 22A with the laser gas flowing in the direction D1 between the discharge electrodes 21A and 22A, a discharge space 23A is formed between the discharge electrodes 21A and 22A. The discharge electrodes 21A and 22A are disposed so that the discharge space 23A is formed upstream of the optical axis OA1 in the direction D1.

When the high-frequency voltage is applied between the discharge electrodes 21B and 22B with the laser gas flowing in the direction D2 between the discharge electrodes 218 and 228, a discharge space 23B is formed between the discharge electrodes 21B and 22B. The discharge electrodes 21B and 22B are disposed so that the discharge space 23B is formed upstream of the optical axis OA1 in the direction D2.

As illustrated in FIG. 2, the gas laser amplifier 10A includes, on the optical axis OA1 in the housing 11, an aperture 31 between the window 12 and the discharge space 23A and an aperture 31 between the window 13 and the discharge space 238. The apertures 31 are members that restrain or prevent self-oscillating light generated on an optical axis different from the optical axis OA1 from being emitted out of the gas laser amplifier 10A. The apertures 31 has its material desirably selected to enable the apertures 31 to have low reflectances to laser beams.

As illustrated in FIG. 1, the gas laser amplifier 10A is a three-axis orthogonal gas laser amplifier having the X-, Y-, and Z-directions orthogonal to one another. Each of the X-directions is a direction of flow of the laser gas, each of the Y directions is a direction of extension of the gap between the electrodes, and each of the Z-directions is a direction of the optical axis OA1.

Next, a description is provided of how the gas laser amplifier 10A operates. The gas flow generation units 25A and 25B cause the laser gases to flow in the directions D1 and D2 illustrated in FIGS. 1 and 2. Accordingly, the laser gases flow between the discharge electrodes 21A and 22A and between the discharge electrodes 21B and 22B. The high-frequency voltage from the high-frequency power supply (not illustrated) is applied between the discharge electrodes 21A and 22A and between the discharge electrodes 21B and 22B, resulting in the formation of the discharge spaces 23A and 23B. The laser gas in the discharge spaces 23A and 23B is excited. The excited laser gas flows toward the optical axes OA1 and OA2, which are located downstream of the discharge electrode pairs 20A and 20B. After crossing the optical axes OA1 and OA2, the laser gas is cooled by the heat exchangers (not illustrated) and is directed by the blowers (not illustrated) into the discharge spaces 23A and 23B to circulate within the housing 11.

The seed laser beam emitted from the laser beam source 2, which is external to the gas laser amplifier 10A, enters the housing 11 through the window 12 along the optical axis OA1. The seed laser beam, which is the p-polarized beam, passes through the polarizing mirror 14 and is propagated to the polarizing mirror 15. The seed laser beam passes through the excited laser gas downstream of each of the discharge spaces 23A and 23B, such that the seed laser beam is amplified into the amplified beam. The p-polarized beam thus amplified passes through the polarizing mirror 15 and exits the housing 11 through the window 13.

On the other hand, a laser beam generated and amplified on an optical axis different from the optical axis OA1 in the gas laser amplifier 10A is blocked by the apertures 31 and thus never exits the windows 12 and 13.

The optical resonator 40 in the housing 11 is defined by the partially reflective mirror 16 and the totally reflective mirror 17. The optical axis OA2 of the optical resonator 40 extends through the partially reflective mirror 16 to the polarizing mirror 14 and then to the polarizing mirror 15, and extends to the totally reflective mirror 17. Between the polarizing mirrors 14 and 15, the optical axis OA2 coincides with the optical axis OA1, so that a laser beam that oscillates within the optical resonator 40 passes through the excited laser gas. The laser beam oscillating within the optical resonator 40, which is polarized to the polarization direction PD2, is reflected by each of the polarizing mirrors 14 and 15. The polarization direction PD2 of the laser beam oscillating within the optical resonator 40 is orthogonal to the polarization direction PD1 of the seed laser beam. Although this laser beam is reflected and amplified between the partially reflective mirror 16 and the totally reflective mirror 17, the laser beam never exits the housing 11 because this laser beam is reflected by the polarizing mirrors 14 and 15. Upon reaching the partially reflective mirror 16, the laser beam is partly transmitted by the partially reflective mirror 16 and absorbed by the damper 18. Even this prevents the laser beam oscillating within the optical resonator 40 from exiting the housing 11. A component polarized to the same direction as the seed laser beam is not reflected by the polarizing mirrors 14 and 15 and thus cannot resonate within the optical resonator 40, resulting in no laser oscillation.

Figure 3:
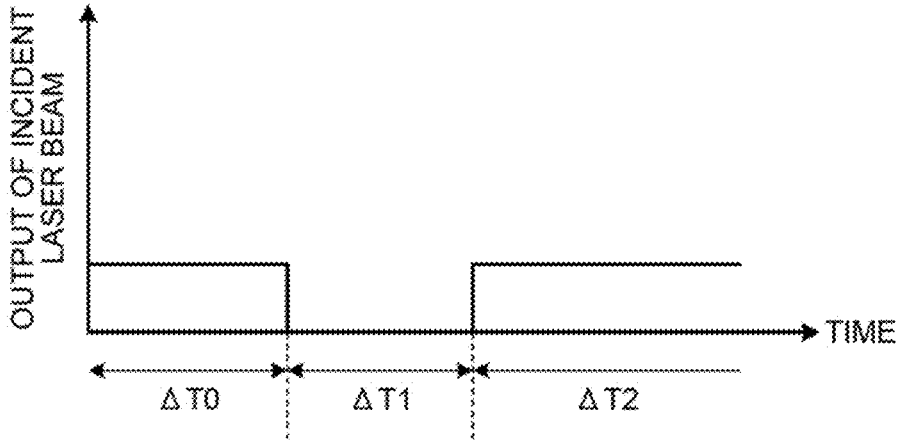
FIG. 3 illustrates an example of how an output of a laser beam that enters a typical gas laser amplifier varies with time.
Figures 4, 5:
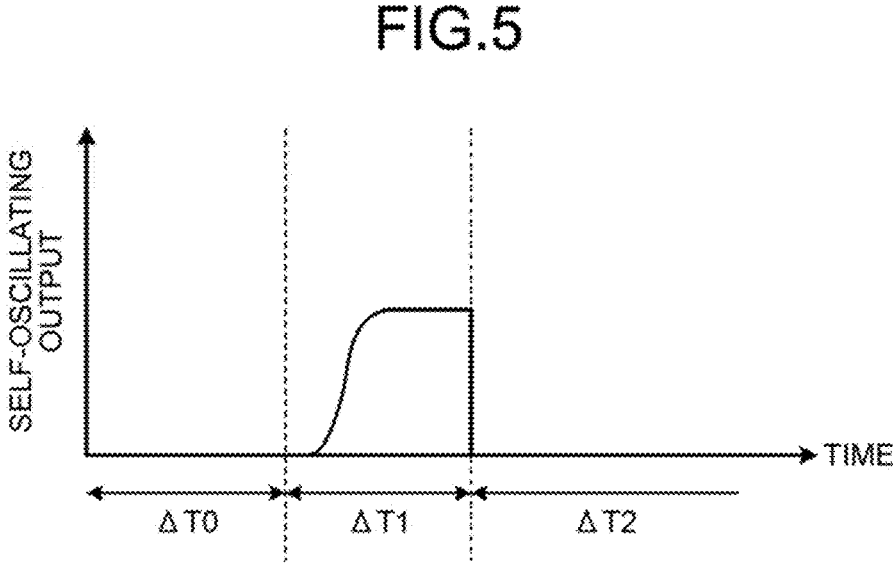
FIG. 4 illustrates an example of how an output of the laser beam amplified by the typical gas laser amplifier varies with time.
FIG. 5 illustrates an example of how a self-oscillating output varies with time.
Figures 6, 7:
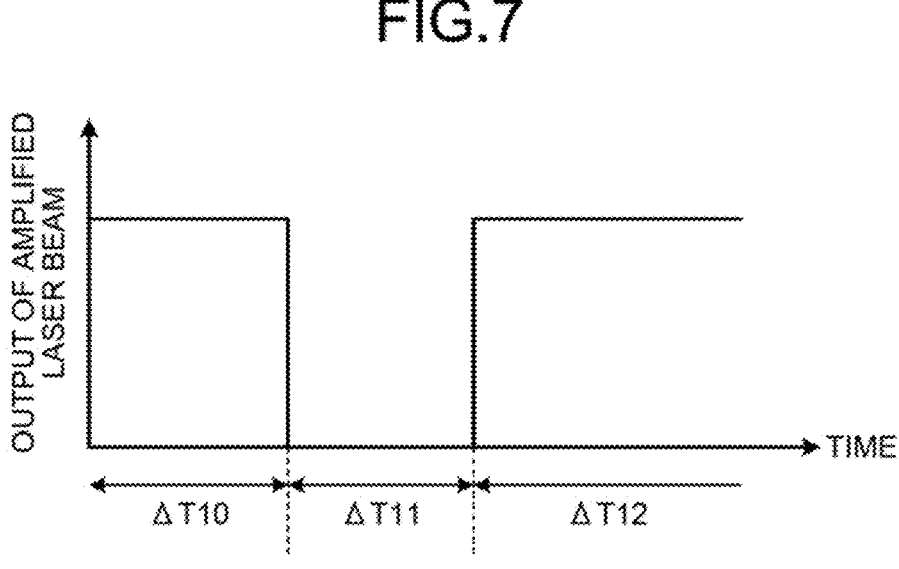
FIG. 6 illustrates an example of how a gain within the typical gas laser amplifier varies with time.
FIG. 7 illustrates an example of how an output of a laser beam amplified by the gas laser amplifier according to the first embodiment varies with time.

A description is provided here of an example of a situation in which self-oscillation occurs in a gas laser amplifier different from that of the first embodiment. FIG. 3 illustrates an example of how an output of a laser beam that enters the typical gas laser amplifier varies with time. FIG. 4 illustrates an example of how an output of the laser beam amplified by the typical gas laser amplifier varies with time. FIG. 5 illustrates an example of how a self-oscillating output varies with time. FIG. 6 illustrates an example of how a gain within the typical gas laser amplifier varies with time. In each of these drawings, a horizontal axis represents time. A vertical axis in FIG. 3 represents the output of the laser beam that enters the gas laser amplifier. A vertical axis in FIG. 4 represents the output of the amplified laser beam. A vertical axis in FIG. 5 represents the self-oscillating output. A vertical axis in FIG. 6 represents the gain $g_a$ within the gas laser amplifier.

In FIG. 6, $g_0$ represents a small-signal gain, $g_s$ represents an oscillation threshold gain for the self-oscillation, and $g_p$ represents a gain during amplification of the laser beam. The small-signal gain $g_0$ refers to an amplification factor per unit length when the input is infinitely close to 0.

During each of intervals $\Delta T0$ and $\Delta T2$, as illustrated in FIG. 3, the seed laser beam enters the gas laser amplifier and is amplified. The gain within the gas laser amplifier is used for amplifying the laser beam, as illustrated by FIG. 4, and the amplified beam exits the gas laser amplifier. As illustrated in FIG. 6, the gain $g_a$ within the gas laser amplifier equals the gain $g_p$ during the amplification of the seed laser beam and is smaller than the oscillation threshold gain $g_s$ for the self-oscillation. As a result, no self-oscillation occurs, as illustrated in FIG. 5.

Assume that during an interval $\Delta T1$, on the other hand, the seed laser beam does not enter the gas laser amplifier due to some problem. In this case, no amplification of the seed laser beam occurs. As a result, the gain $g_a$ within the gas laser amplifier increases and exceeds the oscillation threshold gain $g_s$ for the self-oscillation, as illustrated in FIG. 6, thereby causing the self-oscillation, as illustrated in FIG. 5.

Figure 8:
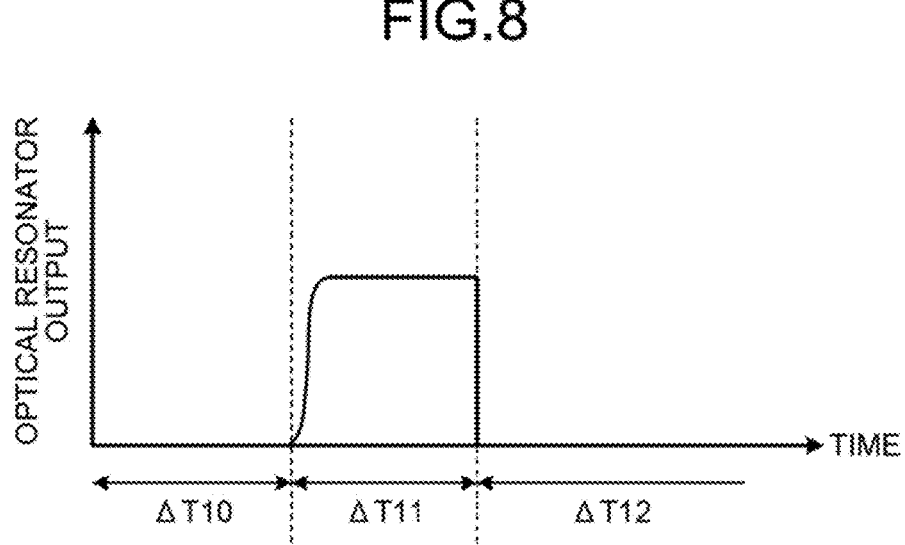
FIG. 8 illustrates an example of how an optical resonator output in the gas laser amplifier according to the first embodiment varies with time.
Figure 9:
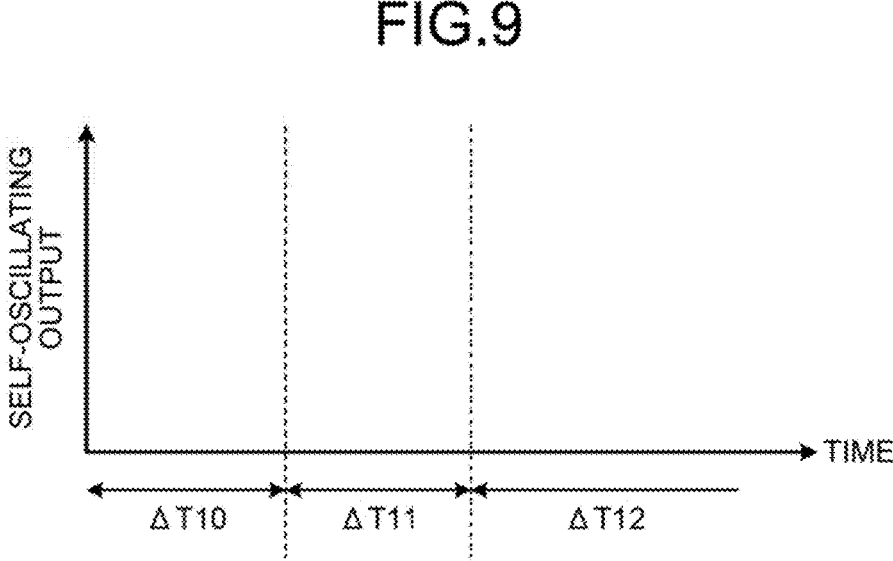
FIG. 9 illustrates an example of how a self-oscillating output in the gas laser amplifier according to the first embodiment varies with time.
Figures 10, 11:
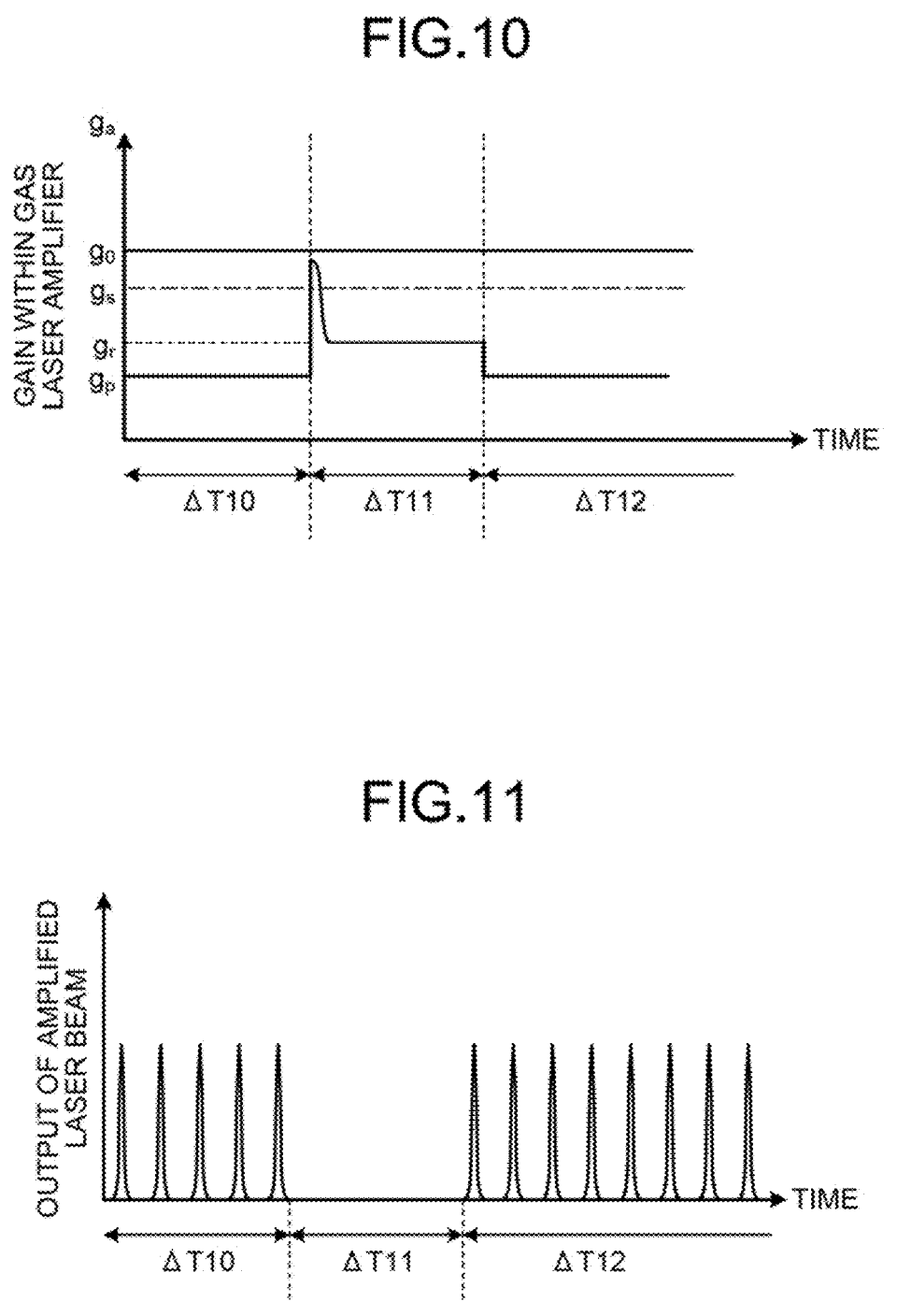

The gas laser amplifier 10A according to the first embodiment prevents self-oscillation during the interval $\Delta T1$ in which no seed laser beam enters the gas laser amplifier 10A. FIG. 7 illustrates an example of how an output of a laser beam amplified by the gas laser amplifier according to the first embodiment varies with time. FIG. 8 illustrates an example of how an optical resonator output in the gas laser amplifier according to the first embodiment varies with time. FIG. 9 illustrates an example of how a self-oscillating output in the gas laser amplifier according to the first embodiment varies with time. FIG. 10 illustrates an example of how a gain within the gas laser amplifier according to the first embodiment varies with time. FIG. 11 illustrates an example of how an output of the laser beam amplified by the gas laser amplifier according to the first embodiment varies with time. In each of these drawings, a horizontal axis represents time.

In FIG. 7, the output of the amplified laser beam represents the amplified output of the seed laser beam exiting through the window 13 after having entered the gas laser amplifier 10A along the optical axis OA1. Illustrated herein is an average output waveform of the pulsed laser with the repetition frequency of from several tens of kHz to several hundreds of kHz. Illustrated in FIG. 11 is an instantaneous output waveform of the pulsed laser with the repetition frequency of from several tens of kHz to several hundreds of KHz.

In FIG. 8, the optical resonator output refers to the output of a laser beam output from the partially reflective mirror 16 of the optical resonator 40 and absorbed by the damper 18. In FIG. 9, the self-oscillating output refers to the output of a self-oscillating output caused by diffracted light or reflection from some component external to the gas laser amplifier 10A or the internal component such as the aperture 31. In FIG. 10, $g_0$ represents a small-signal gain, $g_s$ represents an oscillation threshold gain for the self-oscillation, $g_r$ represents an oscillation threshold gain for the optical resonator 40, and $g_p$ represents a gain during amplification of the laser beam.

During each of intervals $\Delta T10$ and $\Delta T12$ that corresponds to an incident state, the seed laser beam enters and is amplified in the gas laser amplifier 10A. In this state, the seed laser beam having entered consumes the gain within the gas laser amplifier 10A, as described above. Accordingly, the gain $g_a$ within the gas laser amplifier 10A equals the gain $g_p$ during the amplification of the seed laser beam, as illustrated in FIG. 10. In the first embodiment, the oscillation threshold gain $g_r$ for the optical resonator 40 is set at a value larger than the gain $g_p$ during the amplification of the seed laser beam. For this reason, the optical resonator 40 does not provide a gain larger than or equal to the oscillation threshold gain $g_r$. As a result, as illustrated in FIG. 8, the laser beam fails to oscillate. In other words, there is no laser beam from the optical resonator 40. As illustrated in FIG. 10, the oscillation threshold gain $g_s$ for the self-oscillation is similarly larger in value than the gain $g_p$ during the amplification of the seed laser beam. As a result, no self-oscillation occurs, as illustrated in FIG. 9.

During an interval $\Delta T11$ that corresponds to a non-incident state, on the other hand, the seed laser beam does not enter the gas laser amplifier 10A. When the output of the amplified laser beam becomes 0 as in FIG. 7, the gain $g_a$ within the gas laser amplifier 10A becomes the small-signal gain $g_0$ in the interval $\Delta T11$, exceeding the oscillation threshold gain $g_r$ for the optical resonator 40, as illustrated in FIG. 10. For this reason, the laser beam oscillates immediately within the optical resonator 40, as illustrated in FIG. 8. Since the oscillation threshold gain $g_r$ for the optical resonator 40 is smaller than the oscillation threshold gain $g_s$ for the self-oscillation, the laser beam oscillates within the optical resonator 40 before the self-oscillation occurs. In other words, no self-oscillation occurs, as illustrated in FIG. 9. The gain $g_a$ within the gas laser amplifier 10A is consumed by the optical resonator 40, and becomes equal to the oscillation threshold gain $g_r$ for the optical resonator 40. As a result, the gain $g_a$ within the gas laser amplifier 10A becomes smaller than the oscillation threshold gain $g_s$ for the self-oscillation, thereby causing no self-oscillation. In other words, the gas laser amplifier 10A according to the first embodiment is capable of preventing the self-oscillation. As FIG. 8 illustrates, the laser beam oscillating within the optical resonator 40 partly passes through the partially reflective mirror 16 and is absorbed by the damper 18.

Let $g_p$ be a residual gain, that is to say, a gain per unit length during the amplification of the seed laser beam on the optical axis OA1 in the incident state where the seed laser beam enters. An output of the seed laser beam entering the gas laser amplifier 10A is represented by $P_{in}$, and the output of the amplified seed laser beam (amplified beam) exiting the gas laser amplifier 10A is represented by $P_{out}$. The optical axis OA1 includes an optical path length $L_p$ over which an excited laser gas flows, and a gain for the seed laser beam to be amplified along the optical path length $L_p$ of the optical axis OA1 is given by Equation (1) below:

[Formula 1]

$$g_p L_p = \ln\left(\frac{P_{out}}{P_{in}}\right) \tag{1}$$

Let a reflectance of the partially reflective mirror 16 of the optical resonator 40 be $R_1$, and let the oscillation threshold gain $g_r$ be a gain per unit length when the optical resonator 40 causes the oscillation. The optical axis OA2 includes an optical path length $L_r$ over which the excited laser gas flows, and a gain for the laser beam generated within the optical resonator 40 to be amplified along the optical path length $L_r$ of the optical axis OA2 is given by Equation (2) below:

[Formula 2]

$$g_r L_r = -\frac{1}{2}\ln R_1 \tag{2}$$

A condition that should be satisfied in order for the optical resonator 40 to automatically suspend the oscillation when the seed laser beam enters the amplifier is given by Inequality (3) below:

$$g_p L_p < g_r L_r \tag{3}$$

Equations (1) and (2) and Inequality (3) give below Inequality (4) that is a condition which the reflectance $R_1$ of the partially reflective mirror 16 of the optical resonator 40 should satisfy:

[Formula 3]

$$R_1 < \left(\frac{P_{out}}{P_{in}}\right)^{-2} \tag{4}$$

For example, the gas laser amplifier 10A assumed to output a 25 kW amplified beam with respect to an input 100 W seed laser beam has an amplification factor of 250. A condition of the reflectance $R_1$ of the partially reflective mirror 16 in this case is given by Inequality (5) below:

$$R_1 < 16 \times 10^{-6} \tag{5}$$

On the other hand, let beam intensity of the seed laser beam entering be $I_{in}$, let beam intensity of the amplified beam be $I_{out}$, let saturation intensity be $I_s$, and let the small-signal gain be $g_0$. The optical axis OA1 includes the optical path length $L_p$ over which the excited laser gas flows, and a small-signal gain along the optical path length $L_p$ of the optical axis OA1 is given by Equation (6) below:

[Formula 4]

$$g_0 L_p = \ln\left(\frac{I_{out}}{I_{in}}\right) + \left(\frac{I_{out}}{I_{in}} - \frac{I_{in}}{I_s}\right) \tag{6}$$

For example, assume that the saturation intensity $I_s$ is 200 W/cm² and the above 100 W seed laser beam is input, amplified, and output as the 25 kW amplified seed laser beam having a beam diameter φ of 30 mm. Under this condition, the small-signal gain along the optical path length $L_p$ of the optical axis OA1, over which the excited laser gas flows, is given by Equation (7) below:

$$g_0 L_p \approx 23 \tag{7}$$

The self-oscillation is caused by diffracted light or the reflection from the component external to the gas laser amplifier 10A or the internal component such as the aperture 31. For this reason, self-oscillating light provides a very low feedback rate, and, in most cases, an oscillation threshold for the self-oscillation is substantially the same as the small-signal gain $g_0$. Thus, a condition that should be satisfied in order to cause the oscillation within the optical resonator 40 before the generation of the self-oscillating light is given by Inequality (8) below:

$$g_0 L_p > g_r L_r \qquad (8)$$

Equations (2) and (7) give below Inequality (9) that is a condition which the reflectance $R_1$ of the partially reflective mirror 16 of the optical resonator 40 should satisfy:

$$R_1 > 7 \times 10^{-21} \qquad (9)$$

Setting the reflectance $R_1$ of the partially reflective mirror 16 larger than $7 \times 10^{-21}$ and smaller than $16 \times 10^{-6}$ on the basis of Inequalities (5) and (9) enables the above-described prevention of self-oscillation within the gas laser amplifier 10A.

As described above, placing the optical resonator 40 in the gas laser amplifier 10A and appropriately setting the reflectance $R_1$ of the partially reflective mirror 16 of the optical resonator 40 enable the oscillation threshold gain for the laser beam within the optical resonator 40 to be larger than the gain during the amplification of the seed laser beam that enters from outside and smaller than the threshold gain for the self-oscillation. In other words, total resonator loss from the optical resonator 40 is set to take on a value between a gain for the optical resonator 40 in the incident state and a gain for the optical resonator 40 in the non-incident state. Thus, it becomes possible to prevent the self-oscillation.

In FIG. 1, the polarization direction PD1 of the seed laser beam is the X-directions, which are the direction of the gas flow between the discharge electrodes 21A and 22A and the direction of the gas flow between the discharge electrodes 218 and 22B; however, the polarization direction PD1 of the seed laser beam may be the Y-directions along discharge gap lengths, and the polarization direction PD2 of the laser beam generated within the optical resonator 40 may be the X-directions orthogonal to the polarization direction PD1. In other words, the polarizing mirrors 14 and 15 may be those which reflect the p-polarized beam and transmit the s-polarized beam.

In FIG. 1, the optical resonator 40 is placed inside the housing 11; however, the polarizing mirror 14, the partially reflective mirror 16, and the damper 18 may be placed outside the housing 11, and/or the polarizing mirror 15 and the totally reflective mirror 17 may be placed outside the housing 11. In FIG. 1, the partially reflective mirror 16 and the damper 18 are disposed on a side of entry of the seed laser beam, and the totally reflective mirror 17 is disposed on a side of exit of the seed laser beam; however, these positions may be reversed. In other words, the totally reflective mirror 17 may be disposed on the side of entry of the seed laser beam, while the partially reflective mirror 16 and the damper 18 may be disposed on the side of exit of the seed laser beam.

In FIG. 1, the beam that reciprocates within the optical resonator 40 is reflected by the polarizing mirrors 14 and 15 in the direction along the gas flow between the discharge electrodes 21A and 22A and the gas flow between the discharge electrodes 21B and 22B, that is to say, in the X-direction; however, the beam that reciprocates within the optical resonator 40 may be reflected in a direction along the discharge gap lengths, that is to say, in the Y-direction. The gas laser amplifier 10A in FIG. 1 has a single-pass configuration that allows the seed laser beam to pass through the discharge spaces 23A and 23B only once on the optical axis OA1; however, the gas laser amplifier 10A may have, in the housing 11, a turnaround configuration that allows the seed laser beam to pass through the discharge spaces 23A and 23B multiple times as in the embodiments that will be described later.

In order to further amplify the amplified beam from the window 13, one or more gas laser amplifiers may be placed at the state following the gas laser amplifier 10A. The following gas laser amplifier thus placed may be the gas laser amplifier 10A according to the first embodiment or a gas laser amplifier different from that of the first embodiment.

The gas laser amplifier 10A according to the first embodiment includes the optical resonator 40 that causes resonance of a second laser beam having the optical axis OA2 that overlaps the optical axis OA1 of the seed laser beam that enters the amplifier from the external laser beam source 2 and is amplified inside the housing 11. The polarizing mirrors 14 and 15 are provided on the optical axis OA1 to transmit the beam that is polarized to a first direction and reflect the beam that is polarized to a second direction orthogonal to the first direction. The optical resonator 40 includes the partially reflective mirror 16 in the direction of travelling of light relected by the polarizing mirror 14, and the totally reflective mirror 17 in the direction of travelling of light reflected by the polarizing mirror 15. The damper 18 is disposed at a stage following the partially reflective mirror 16 on the optical axis OA2 and absorbs the laser beam. The reflectance $R_1$ of the partially reflective mirror 16 is set such that the oscillation threshold gain for the laser beam within the optical resonator 40 is larger than the gain during the amplification of the seed laser beam that enters the amplifier from outside, and smaller than the threshold gain for the self-oscillation. As a result, when the seed laser beam does not enter the gas laser amplifier 10A, laser oscillation occurs within the optical resonator 40 before the generation of self-oscillating light, thus preventing the self-oscillation. When laser beams are generated along an optical axis coinciding with the optical axis OA1 of the seed laser beam, a beam having a component polarized to the first direction is not reflected by the polarizing mirrors 14 and 15 and thus is not amplified by the optical resonator 40. A beam having a component polarized to the second direction is amplified by the optical resonator 40 and partly passes through the partially reflective mirror 16 and absorbed by the damper 18 without exiting the gas laser amplifier 10A. Consequently, self-oscillating light generated on the same optical axis as the seed laser beam within the gas laser amplifier 10A can be prevented from exiting without use of a device that varies the loss from the optical resonator 40 over time.

Second Embodiment

Figure 12:
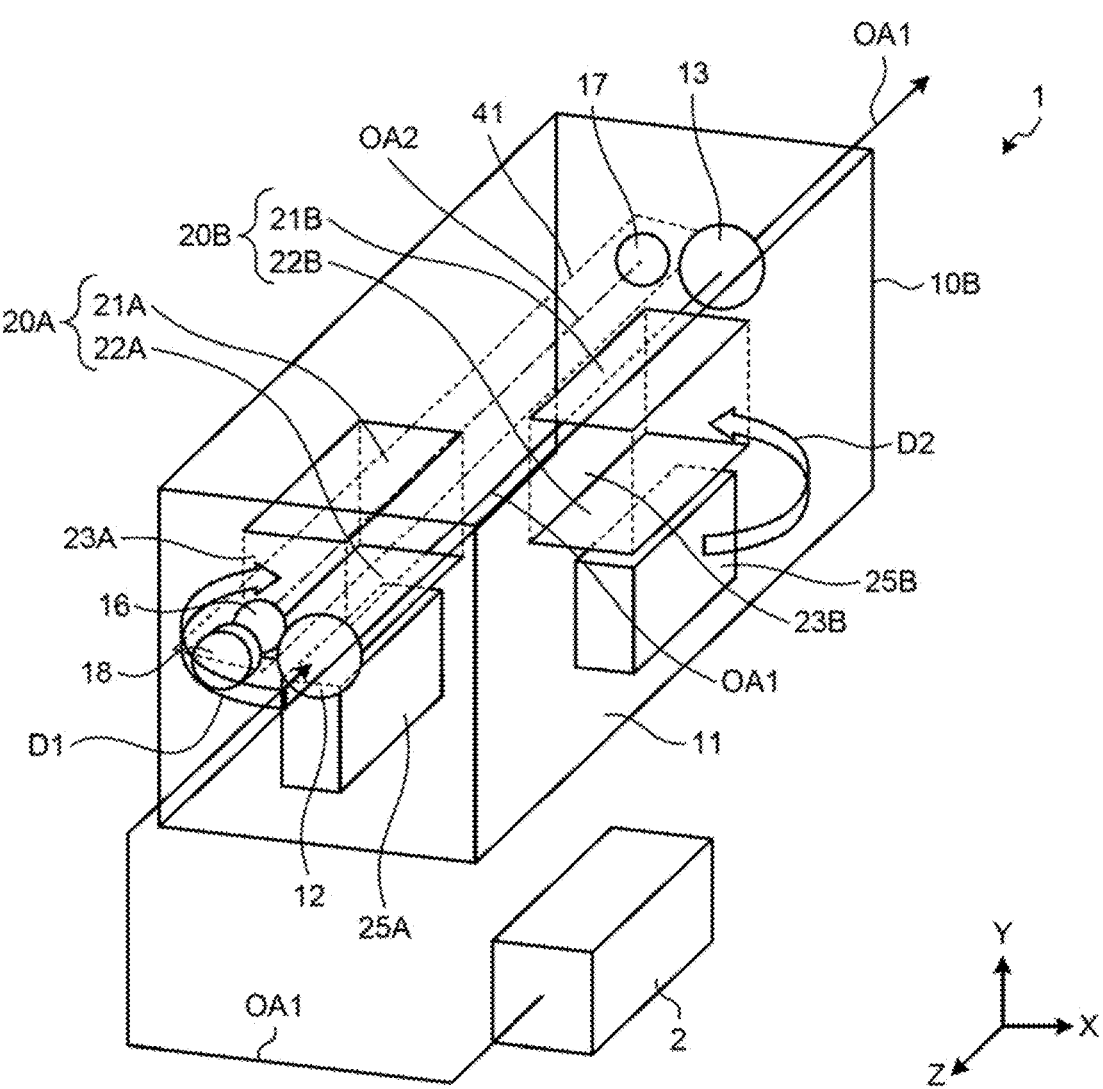
FIG. 12 is a perspective view schematically illustrating a configuration example of a gas laser apparatus that includes a gas laser amplifier according to a second embodiment.
Figure 13:
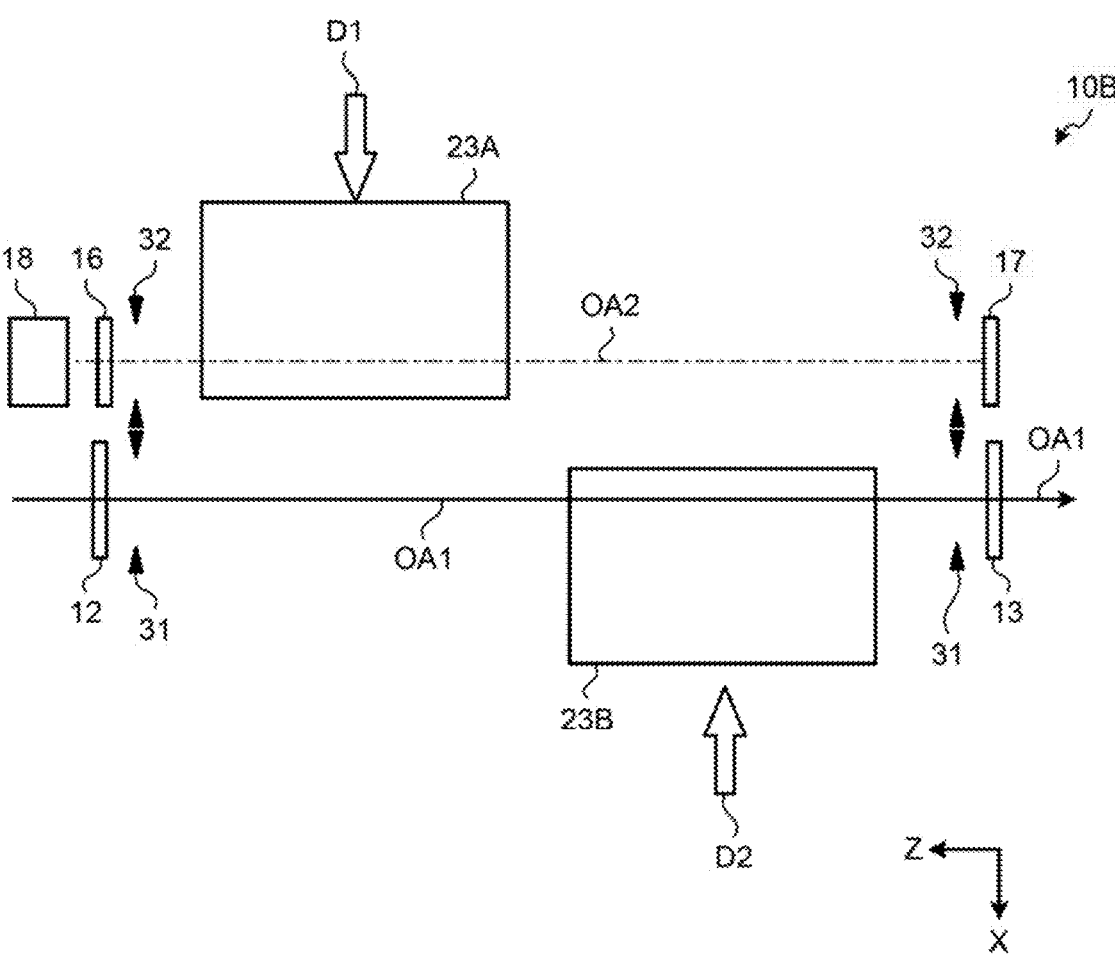
FIG. 13 illustrates an interior of the gas laser amplifier of FIG. 12 as viewed in a Y-direction.

FIG. 12 is a perspective view schematically illustrating a configuration example of a gas laser apparatus that includes a gas laser amplifier according to the second embodiment. FIG. 13 illustrates an interior of the gas laser amplifier of FIG. 12 as viewed in a Y-direction. A description is hereinafter provided of difference from the first embodiment. Parts identical with those in the first embodiment have the same reference characters and are not described.

In the first embodiment, the optical axis OA1 of the seed laser beam overlaps the optical axis OA2 of the laser beam that oscillates within the optical resonator 40. In the second embodiment, the optical axis OA1 of a seed laser beam and the optical axis OA2 along which a laser beam oscillates within an optical resonator 41 do not overlap.

In other words, no optical components other than the apertures 31 are disposed on the optical axis OA1 that passes through the windows 12 and 13. The apertures 31 are provided between the window 12 and a position on the optical axis OA1 that corresponds to the discharge space 23A, and between the discharge space 238 and the window 13 on the optical axis OA1.

The gas laser amplifier 10B includes the optical resonator 41 in the housing 11. The optical resonator 41 includes the partially reflective mirror 16, the totally reflective mirror 17, and the damper 18. The optical axis OA2 of the laser beam that oscillates within the optical resonator 41 is disposed in parallel to the optical axis OA1 and at a different position from the optical axis OA1. In the example of FIGS. 12 and 13, the optical axis OA2 is spaced in a negative X-direction from the optical axis OA1 in an XZ plane and in parallel to the optical axis OA1. The damper 18 is disposed in such a position as to absorb a laser beam passing through the partially reflective mirror 16. This laser beams having oscillated within the optical resonator 41 is output from the partially reflective mirror 16, and absorbed by the damper 18. Consequently, all of the laser beams having oscillated within the optical resonator 41 are absorbed by the damper 18 and thus never exits the gas laser amplifier 10B.

The gas laser amplifier 10B further includes apertures 32 on the optical axis OA2. The apertures 32 are disposed between the discharge space 23A and the partially reflective mirror 16, and between the totally reflective mirror 17 and a position on the optical axis OA2 that corresponds to the discharge space 23B.

In the second embodiment, the discharge electrodes 21A and 22A are disposed in such a manner that the discharge space 23A includes the optical axis OA2, and the discharge electrodes 21B and 22B are disposed in such a manner that the discharge space 238 includes the optical axis OA1.

A description is provided here of how the gas laser amplifier 10B operates. The gas flow generation units 25A and 25B cause laser gases to flow in the directions D1 and D2 illustrated in FIGS. 12 and 13. Accordingly, the laser gases flow between the discharge electrodes 21A and 22A and between the discharge electrodes 21B and 22B. A high-frequency voltage from a high-frequency power supply (not illustrated) is applied between the discharge electrodes 21A and 22A and between the discharge electrodes 21B and 228, resulting in the formation of the discharge spaces 23A and 23B. The laser gases in the discharge spaces 23A and 23B are excited. The excited laser gases flow toward the optical axes OA1 and OA2 each located on a downstream side of the corresponding one of the discharge electrode pairs 20A and 20B. After crossing the optical axes OA1 and OA2, the laser gases are cooled by heat exchangers (not illustrated) and directed by blowers (not illustrated) into the discharge spaces 23A and 23B to circulate within the housing 11. The seed laser beam may be a pulsed laser beam having a repetition frequency ranging from several tens of kHz to several hundreds of kHz or a continuous-wave laser beam.

The seed laser beam emitted from the laser beam source 2 that is external to the gas laser amplifier 10B enters the housing 11 through the window 12 along the optical axis OA1. In passing through the downstream side of the discharge space 23A and then though the discharge space 238, the seed laser beam passes through the excited laser gas, such that the seed laser gas is amplified into an amplified beam. The amplified beam exits the housing 11 through the window 13.

The reflectance $R_1$ of the partially reflective mirror 16 of the optical resonator 41 is set such that the oscillation threshold gain $g_r$ for the optical resonator 41 satisfies conditions below.

Figure 14:
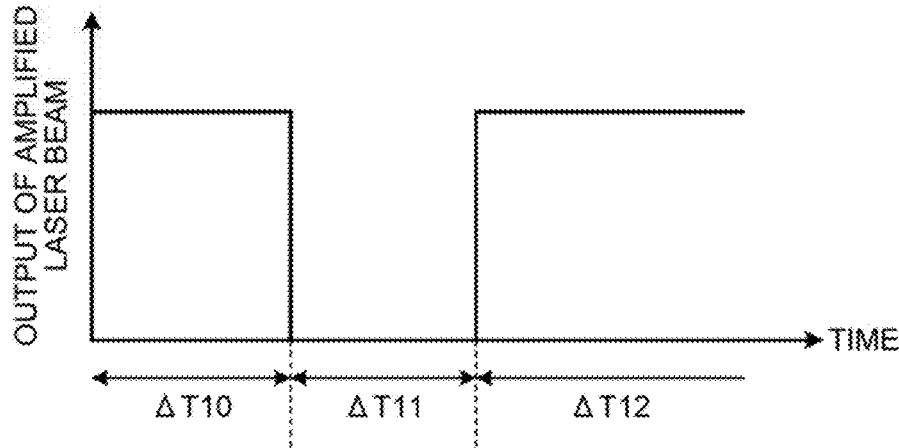
FIG. 14 illustrates an example of how an output of a laser beam amplified by the gas laser amplifier according to the second embodiment varies with time.
Figures 15, 16:
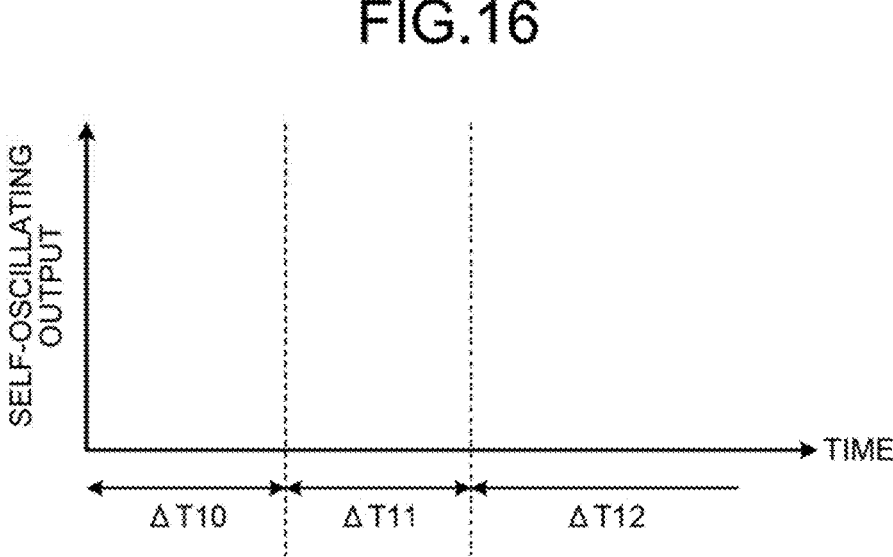
FIG. 15 illustrates an example of how an optical resonator output in the gas laser amplifier according to the second embodiment varies with time.
FIG. 16 illustrates an example of how a self-oscillating output in the gas laser amplifier according to the second embodiment varies with time.
Figure 17:
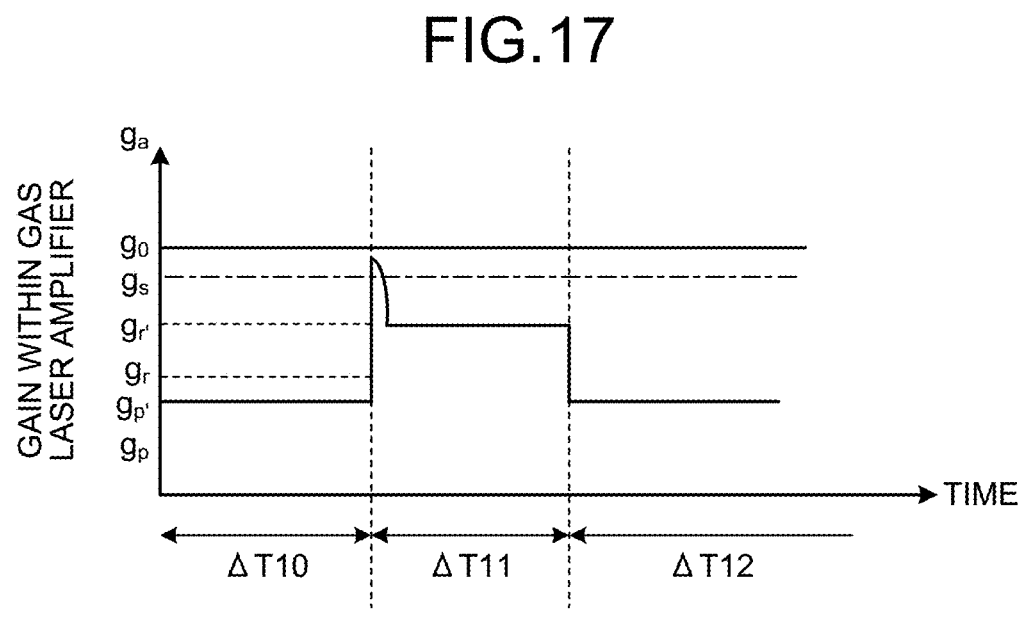

FIG. 14 illustrates an example of how an output of a laser beam amplified by the gas laser amplifier according to the second embodiment varies with time. FIG. 15 illustrates an example of how an optical resonator output in the gas laser amplifier according to the second embodiment varies with time. FIG. 16 illustrates an example of how a self-oscillating output in the gas laser amplifier according to the second embodiment varies with time. FIG. 17 illustrates an example of how a gain within the gas laser amplifier according to the second embodiment varies with time. In each of these drawings, a horizontal axis represents time.

In FIG. 17, $g_r'$ represents a gain on the optical axis OA1 during oscillation within the optical resonator 41, and $g_p'$ represents a gain on the optical axis OA2 during the amplification of the seed laser beam. Descriptions of those that are the same as in FIGS. 7 to 10 are omitted.

During each of the intervals ΔT10 and ΔT12 where the seed laser beam enters and is amplified in the gas laser amplifier 10B, the oscillation threshold gain $g_r$ for the optical resonator 41 is set at a valve larger than the gain $g_p'$ on the optical axis OA2 during the amplification of the seed laser beam. Therefore, while the seed laser beam is amplified and exits through the window 13, the optical resonator 41 does not provide a gain larger than or equal to the oscillation threshold gain gr. As a result, the laser beam fails to oscillate, as illustrated in FIG. 15. In other words, there is no laser beam from the optical resonator 41. Similarly, the oscillation threshold gain $g_s$ for self-oscillation is larger in value than the gain $g_p$ on the optical axis OA1 during the amplification of the laser beam. As a result, no self-oscillation occurs, as illustrated in FIG. 16.

On the other hand, in the interval ΔT11 during which the seed laser beam does not enter the gas laser amplifier 108, the gain $g_a$ within the gas laser amplifier 10B exceeds the oscillation threshold gain $g_r$ for the optical resonator 41, as illustrated in FIG. 17 when the output of the amplified laser beam becomes 0 as in FIG. 14. For this reason, the laser beam oscillates immediately within the optical resonator 41, as illustrated in FIG. 15. Since the oscillation threshold gain $g_r$ for the optical resonator 41 is smaller than the oscillation threshold gain $g_s$ for the self-oscillation, the laser beam oscillates within the optical resonator 41 before the self-oscillation occurs. In other words, no self-oscillation occurs, as illustrated in FIG. 16. The gain $g_a$ on the optical axis OA1 within the gas laser amplifier 10B is consumed by the optical resonator 41, and becomes equal to the gain $g_r'$ on the optical axis OA1 during the oscillation within the optical resonator 41. As a result, the gain $g_a$ within the gas laser amplifier 10B becomes smaller than the oscillation threshold gain $g_s$ for the self-oscillation, thereby causing no self-oscillation. In other words, the gas laser amplifier 108 according to the second embodiment is capable of preventing the self-oscillation. As FIG. 15 illustrates, the laser beam oscillating within the optical resonator 41 is partly transmitted by the partially reflective mirror 16 and absorbed by the damper 18.

As described above, the optical resonator 41 is placed in the gas laser amplifier 10B according to the second embodiment, and the oscillation threshold gain for the optical resonator 41 is set larger than the gain during the amplification of the seed laser beam that enters the amplifier from outside, and smaller than the threshold gain for the self-oscillation. As a result, when the seed laser beam does not enter the amplifier, the laser beam oscillates immediately within the optical resonator 41, thereby preventing the self-oscillation.

The gas laser amplifier 10B in FIG. 12 has a single-pass configuration that allows the seed laser beam to pass through the discharge spaces 23A and 23B only once on the optical axis OA1; however, the gas laser amplifier 10B may have, in the housing 11, a turnaround configuration that causes the seed laser beam to pass through the discharge spaces 23A and 23B multiple times as in the embodiments that will be described later.

In FIG. 12, the partially reflective mirror 16 and the damper 18 are disposed on a side of entry of the seed laser beam, and the totally reflective mirror 17 is disposed on a side of exist of the seed laser beam; however, these positions may be reversed. In other words, the totally reflective mirror 17 may be disposed on the side of entry of the seed laser beam, while the partially reflective mirror 16 and the damper 18 may be disposed on the side of exit of the seed laser beam.

Third Embodiment

Figure 18:
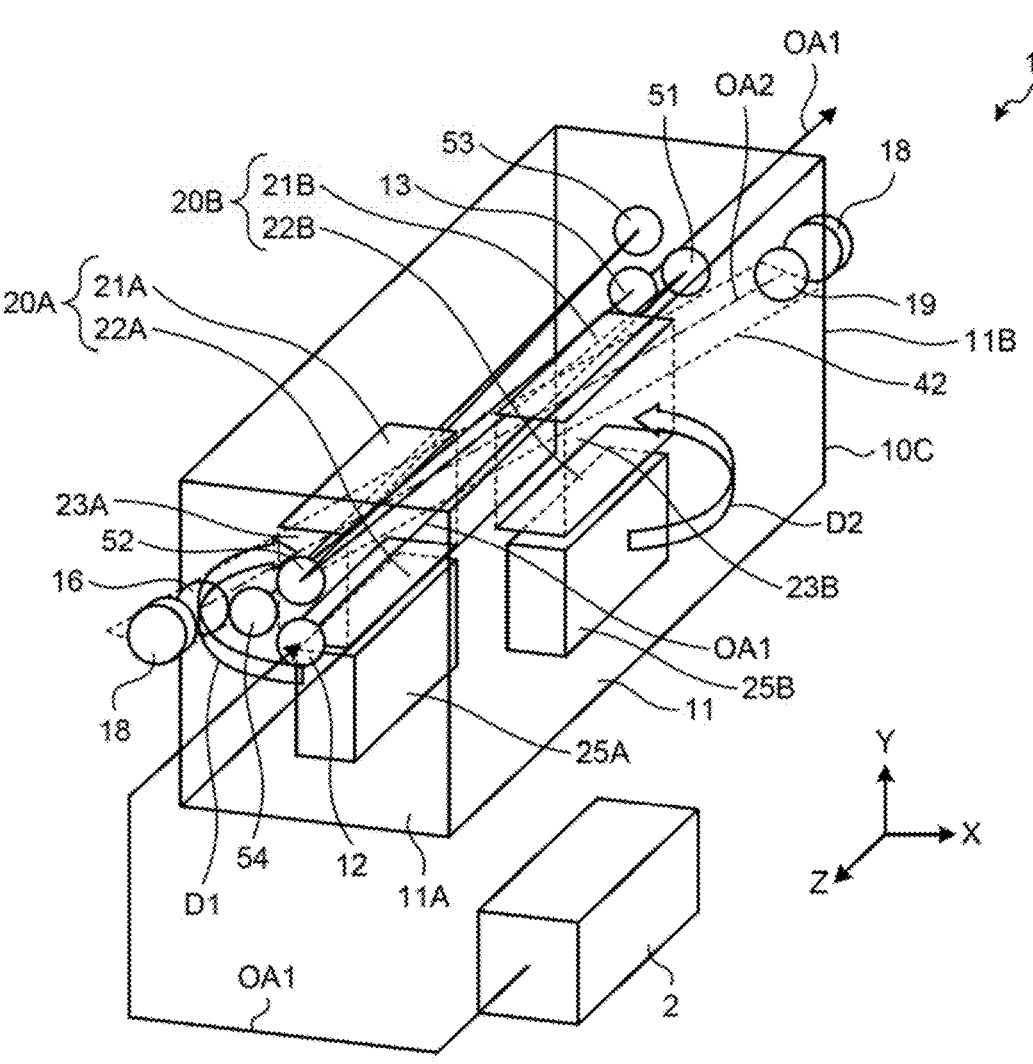
FIG. 18 is a perspective view schematically illustrating a configuration example of a gas laser apparatus that includes a gas laser amplifier according to a third embodiment.
Figure 19:
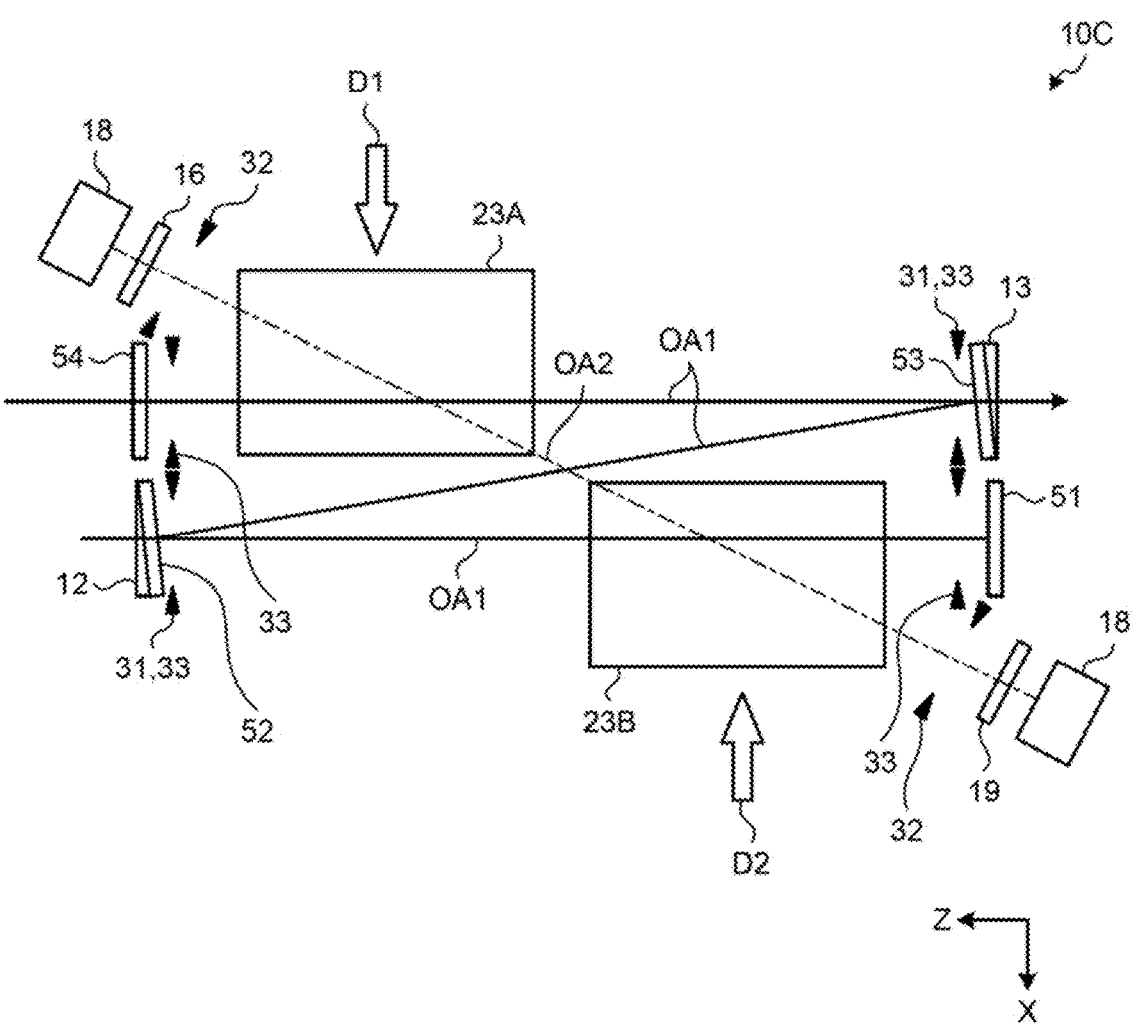
FIG. 19 illustrates an interior of the FIG. 18 gas laser amplifier as viewed in a Y-direction.

FIG. 18 is a perspective view schematically illustrating a configuration example of a gas laser apparatus that includes a gas laser amplifier according to the third embodiment. FIG. 19 illustrates an interior of the gas laser amplifier of FIG. 18 as viewed in a Y-direction. A description is hereinafter provided of difference from the first and second embodiments. Parts identical with those in the first and second embodiments have the same reference characters and are not described.

In the first and second embodiments, the windows 12 and 13 are disposed on the single straight line extending in the z-direction. In the third embodiment, however, the windows 12 and 13 are not on a single straight line extending in a Z-direction but in different positions in an XY plane as well as in an XZ plane. In other words, the optical axis OA1 of a seed laser beam is turned around within the housing 11.

The gas laser amplifier 10C includes reflecting mirrors 51, 52, 53, and 54. The reflecting mirrors 51 and 53 are provided at the side face 11B of the housing 11 that has the window 13 disposed thereon, and the reflecting mirrors 52 and 54 are provided at the side face 11A of the housing 11 that has the window 12 disposed thereon. The reflecting mirrors 51 to 54 are disposed in the housing 11 at the side faces 11A and 11B such that the seed laser beam entering the amplifier 10C through the window 12 is guided to the window 13. As a result, the optical axis OA1 extends from the window 12 to the window 13 via the reflecting mirrors 51, 52, 53, and 54.

The gas laser amplifier 10C includes the partially reflective mirror 16, a partially reflective mirror 19, and the dampers 18. The partially reflective mirrors 16 and 19 define an optical resonator 42. The partially reflective mirrors 16 and 19 are disposed in the housing 11 such that the optical axis OA2 of a laser beam oscillating within the optical resonator 42 crosses the optical axis OA1 of the seed laser beam. In the example of FIGS. 18 and 19, the partially reflective mirror 16 is provided on an upstream side of a gas that flows between the discharge electrodes 21A and 22A, which upstream side is located between the side face 11A provided with the window 12, and the discharge electrode pair 20A disposed on a side of entry of the seed laser beam. The partially reflective mirror 19 is disposed on an upstream side of a gas that flows between the discharge electrodes 21B and 22B, which upstream side is located between the side face 11B provided with the window 13, and the discharge electrode pair 20B disposed on the side of exit of the seed laser beam. For this reason, ends of the optical axis OA2 of the optical resonator 42, which are close to the partially reflective mirrors 16 and 19, are located on an upstream side of flows of gas away from the optical axis OA1. A central portion of the optical axis OA2, which portion crosses the optical axis OA1, substantially shares an excited laser gas with the optical axis OA1.

Each of the dampers 18 is disposed to absorb a laser beam passing through the partially reflective mirror 16 or 19. A portion of the laser beam having oscillated within the optical resonator 42 is emitted from the partially reflective mirror 16 or 19 and is completely absorbed by the damper 18. In FIGS. 18 and 19, the partially reflective mirrors 16 and 19 of the optical resonator 42, and the dampers 18 are disposed outside the housing 11 but may be disposed in the housing 11.

The gas laser amplifier 10C includes the apertures 31 and 32 and apertures 33 on the optical axes OA1 and OA2. The apertures 31 are disposed between the window 12 and a position on the optical axis OA1 that corresponds to the discharge space 23A, and between the window 13 and a position on the optical axis OA1 that corresponds to the discharge space 23B. The apertures 33 are disposed between the discharge space 23B and the reflecting mirror 51 on the optical axis OA1, between the reflecting mirror 52 and a position on the optical axis OA1 that corresponds to the discharge space 23A, between the reflecting mirror 53 and a position on the optical axis OA1 that corresponds to the discharge space 238, and between the reflecting mirror 54 and the discharge space 23A on the optical axis OA1. The apertures 32 are disposed between the partially reflective mirror 16 and the discharge space 23A on the optical axis OA2, and between the partially reflective mirror 19 and the discharge space 23B on the optical axis OA2.

In the third embodiment, the discharge electrodes 21B and 22B are disposed such that the discharge space 23B includes a portion of the optical axis OA1 interconnecting the window 12 and the reflecting mirror 51. The discharge electrodes 21A and 22A are disposed such that the discharge space 23A includes a portion of the optical axis OA1 interconnecting the reflecting mirror 54 and the window 13.

A description is provided here of how the gas laser amplifier 10C operates. The gas flow generation units 25A and 25B cause laser gases to flow in the directions D1 and D2 illustrated in FIGS. 18 and 19. Accordingly, the laser gases flow between the discharge electrodes 21A and 22A and between the discharge electrodes 21B and 22B. A high-frequency voltage from a high-frequency power supply (not illustrated) is applied between the discharge electrodes 21A and 22A and between the discharge electrodes 218 and 22B, resulting in the formation of the discharge spaces 23A and 23B. The laser gases in the discharge spaces 23A and 23B are excited. The excited laser gases flow toward the optical axes OA1 each located on a downstream side of the corresponding one of the discharge electrode pairs 20A and 20B. The optical axis OA2 is mostly disposed in the discharge spaces 23A and 23B. After crossing the optical axes OA1 and OA2, the laser gas is cooled by heat exchangers (not illustrated) and is directed by blowers (not illustrated) into the discharge spaces 23A and 23B to circulate within the housing 11. The seed laser beam may be a pulsed laser beam having a repetition frequency ranging from several tens of kHz to several hundreds of kHz or a continuous-wave laser beam.

The seed laser beam emitted from the laser beam source 2 that is external to the gas laser amplifier 10C enters the housing 11 through the window 12 and is propagated along the optical axis OA1. The seed laser beam passes through the excited laser gas, is reflected by the reflecting mirror 51, passes through the excited laser gas again, and is reflected by the reflecting mirror 52. After that, the seed laser beam is reflected by the reflecting mirrors 53 and 54 in the similar manner. The seed laser beam is amplified by passing through the excited laser gases as the seed laser beam is reflected by each of the reflecting mirrors 51 to 54. The amplified beam, which is a seed laser beam undergoing the last amplification, exits the housing 11 through the window 13. In FIGS. 18 and 19, the seed laser beam is amplified in the excited laser gases, turning around four times. Although the above description is made as to the seed laser beam turning around four time by way of example, the number of times the seed laser beam turns around may be greater than or equal to two.

The reflectance $R_1$ of the partially reflective mirror 16 and a reflectance $R_2$ of the partially reflective mirror 19 of the optical resonator 42 are set such that the oscillation threshold gain $g_r$ for the optical resonator 42 satisfies conditions below. Reference is made back to FIGS. 14 to 17 of the second embodiment because the gas laser amplifier 10C according to the third embodiment operates in the manner as illustrated in FIGS. 14 to 17.

The oscillation threshold gain $g_r$ for the optical resonator 42 defined by the partially reflective mirrors 16 and 19 is set at a value larger than the gain $g_p'$ on the optical axis OA2 during the amplification of the seed laser beam that enters the gas laser amplifier 10C in each of the intervals $\Delta T10$ and $\Delta T12$. Therefore, while the seed laser beam is amplified and exits the amplifier through the window 13, the optical resonator 42 does not provide a gain larger than or equal to the oscillation threshold gain $g_r$. As a result, the laser beam fails to oscillate, as illustrated in FIG. 15. In other words, there is no laser beam from the optical resonator 42. Similarly, the oscillation threshold gain $g_s$ for self-oscillation is larger in value than the gain $g_r$ on the optical axis OA1 during the amplification of the seed laser beam. As a result, no self-oscillation occurs, as illustrated in FIG. 16.

On the other hand, in the interval $\Delta T11$ during which the seed laser beam does not enter the gas laser amplifier 10C, the gain $g_a$ within the gas laser amplifier 10C exceeds the oscillation threshold gain $g_r$ for the optical resonator 42, as illustrated in FIG. 17 when the output of the amplified laser beam becomes 0 as in FIG. 14. For this reason, the laser beam oscillates immediately within the optical resonator 42, as illustrated in FIG. 15. Since the oscillation threshold gain $g_r$ for the optical resonator 42 is smaller than the oscillation threshold gain $g_s$ for the self-oscillation, the laser beam oscillates within the optical resonator 42 before the self-oscillation occurs. In other words, no self-oscillation occurs, as illustrated in FIG. 16. The gain $g_s$ on the optical axis OA1 within the gas laser amplifier 10C is consumed by the optical resonator 42, and becomes equal to the gain $g_p'$ on the optical axis OA1 during the oscillation within the optical resonator 42. As a result, the gain $g_a$ within the gas laser amplifier 10C becomes smaller than the oscillation threshold gain $g_s$ for the self-oscillation, thereby causing no self-oscillation. In other words, the gas laser amplifier 10C according to the third embodiment is capable of preventing the self-oscillation. As FIG. 15 illustrates, the laser beam oscillating within the optical resonator 42 partly passes through the partially reflective mirrors 16 and 19 and is absorbed by the dampers 18.

In the third embodiment, the reflecting mirrors 51 to 54 are disposed in a path extending extends from the window 12 to the window 13 in the housing 11, so that the optical axis OA1 of the excited laser gas is longer than that in the first and second embodiments. Consequently, in addition to the effects as in the first and second embodiments, the seed laser beam has an effect of providing the amplified beam having a greater output than those of the first and second embodiments.

Fourth Embodiment

Figure 20:
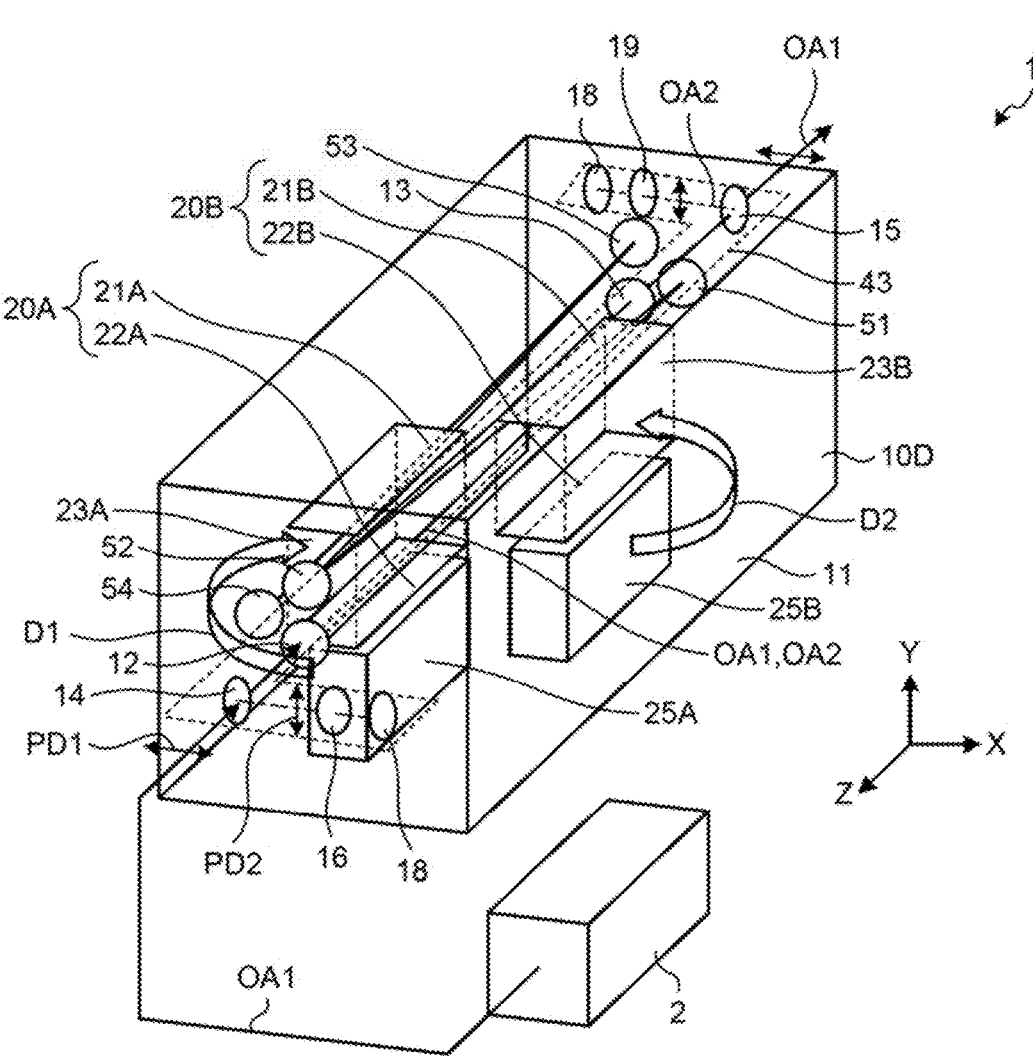
FIG. 20 is a perspective view schematically illustrating a configuration example of a gas laser apparatus that includes a gas laser amplifier according to a fourth embodiment.
Figure 21:
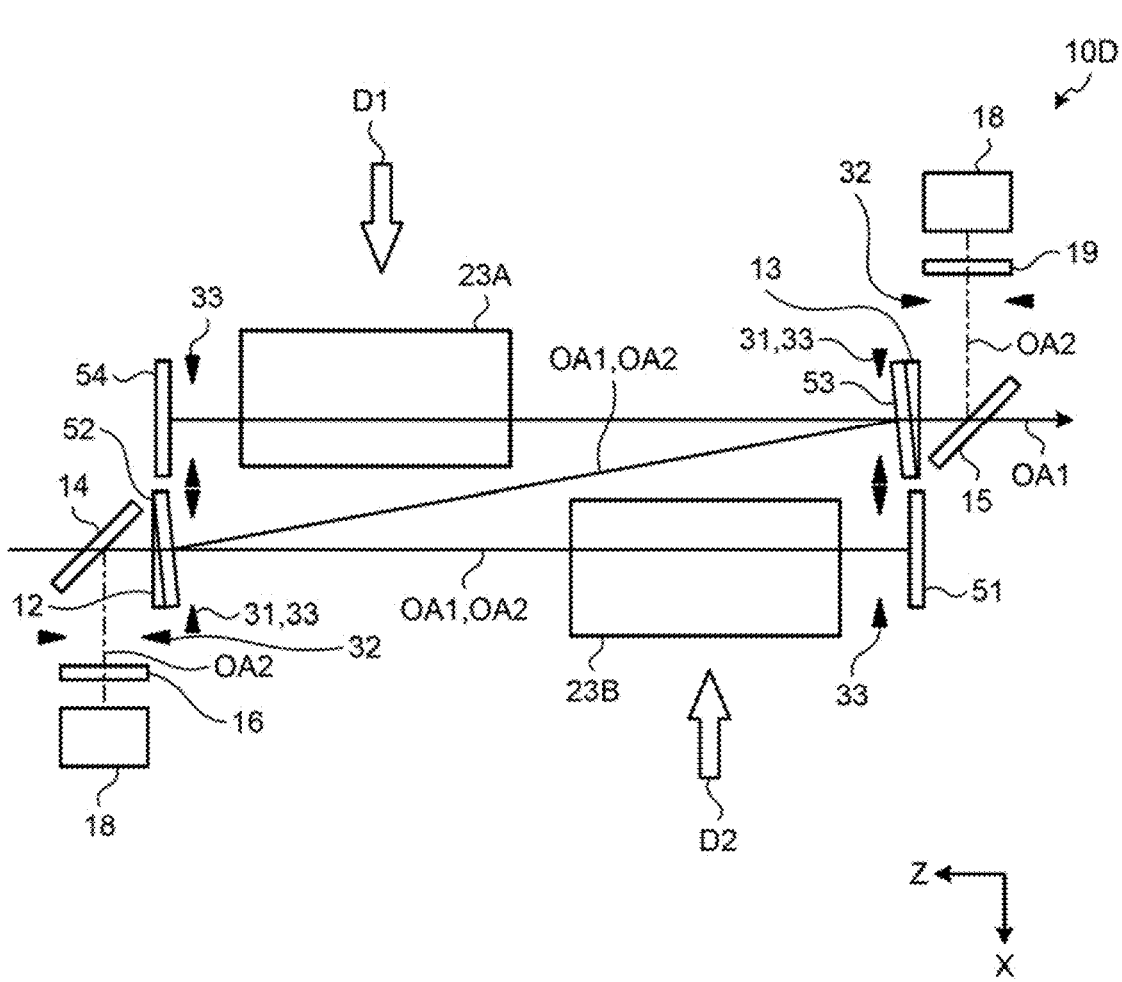
FIG. 21 illustrates an interior of the FIG. 20 gas laser amplifier as viewed in a Y-direction.

FIG. 20 is a perspective view schematically illustrating a configuration example of a gas laser apparatus that includes a gas laser amplifier according to the fourth embodiment. FIG. 21 illustrates an interior of the gas laser amplifier of FIG. 20 as viewed in a Y-direction. A description is hereinafter provided of difference from the first through third embodiments. Parts identical with those in the first through third embodiments have the same reference characters and are not described.

The gas laser amplifier 10D according to the fourth embodiment includes the same optical components as that of the third embodiment for forming the optical axis OA1 on which a seed laser beam is amplified; however, a configuration of an optical resonator 43 of the fourth embodiment is different from that of the third embodiment. In the fourth embodiment, the optical axis OA2 of a laser beam that oscillates within the optical resonator 43 overlaps a portion of the optical axis OA1 of the seed laser beam.

The gas laser amplifier 10D includes the polarizing mirrors 14 and 15, the partially reflective mirrors 16 and 19, and the dampers 18. The polarizing mirrors 14 and 15 are disposed outside the housing 11 on the optical axis OA1. The polarizing mirror 14 is external to the window 12 on the optical axis OA1, and the polarizing mirror 15 is external to the window 13 on the optical axis OA1. The polarizing mirrors 14 and 15 transmit the seed laser beam and an amplified beam having the same polarization direction PD1 as the seed laser beam, and reflect a laser beam having the polarization direction PD2 orthogonal to the polarization direction PD1. In other words, the polarizing mirrors 14 and 15 transmit a p-polarized beam but reflect an s-polarized beam in X-directions. The polarizing mirrors 14 and 15 are disposed to reflect the s-polarized beam in the X-directions.

The partially reflective mirror 16 transmits a portion of the laser beam reflected in the X-direction by the polarizing mirror 14 and reflects, to the polarizing mirror 14, a remaining portion of the laser beam having not passed through the mirror 16. The partially reflective mirror 19 transmits a portion of the laser beam reflected in the X-direction by the polarizing mirror 15 and reflects, to the polarizing mirror 15, a remaining portion of the laser beam having not passed through the mirror 19.

The dampers 18 are disposed to absorb the laser beams having passed through the partially reflective mirror 16 and 19. The laser beams, which oscillate within the optical resonator 43, are output from the partially reflective mirrors 16 and 19 and all absorbed by the dampers 18.

The partially reflective mirrors 16 and 19 define the optical resonator 43. Between the polarizing mirrors 14 and 15, the optical axis OA2 of the laser beam that oscillates within the optical resonator 43 coincides with the optical axis OA1. The laser beam oscillating within the optical resonator 43 is amplified by reciprocating between the partially reflective mirrors 16 and 19. The laser beam oscillating within the optical resonator 43, which is polarized to the polarization direction PD2 orthogonal to the polarization direction PD1 of the seed laser beam, is reflected by the polarizing mirrors 14 and 15. The laser beam that oscillates within the optical resonator 43 is reflected by the polarizing mirrors 14 and 15 and is not emitted through the gas laser amplifier 10D. Moreover, the portion of the laser beam having passed through the partially reflective mirror 16 or 19 is absorbed by the damper 18.

The gas laser amplifier 10D includes the apertures 32 on the optical axes OA2. The apertures 32 are disposed between the partially reflective mirror 16 and the polarizing mirror 14 on the optical axis OA2, and between the polarizing mirror 15 and the partially reflective mirror 19.

A description is provided here of how the gas laser amplifier 10D operates. The gas flow generation units 25A and 25B cause laser gases to flow in the directions D1 and D2 illustrated in FIGS. 20 and 21. Accordingly, the laser gases flow between the discharge electrodes 21A and 22A and between the discharge electrodes 21B and 22B. A high-frequency voltage from a high-frequency power supply (not illustrated) is applied between the discharge electrodes 21A and 22A and between the discharge electrodes 21B and 22B, resulting in the formation of the discharge spaces 23A and 23B. The laser gases in the discharge spaces 23A and 23B are excited. The excited laser gases flow toward the optical axes OA1 and OA2 each located on a downstream side of the corresponding one of the discharge electrode pairs 20A and 20B. After crossing the optical axes OA1 and OA2, the laser gases are cooled by heat exchangers (not illustrated) and directed by blowers (not illustrated) into the discharge spaces 23A and 23B to circulate within the housing 11. The seed laser beam may be a pulsed laser beam having a repetition frequency ranging from several tens of kHz to several hundreds of kHz or a continuous-wave laser beam.

The seed laser beam emitted from the laser beam source 2 that is external to the gas laser amplifier 10D is propagated along the optical axis OA1. The seed laser beam, which is the p-polarized beam, passes through the polarizing mirror 14 and enters the housing 11 through the window 12. The seed laser beam passes through the excited laser gas, is reflected by the reflecting mirror 51, passes through the excited laser gas again, and is reflected by the reflecting mirror 52. After that, the seed laser beam is reflected by the reflecting mirrors 53 and 54 in the similar manner. The seed laser beam is amplified by passing through the excited laser gases as the sead laser beam is reflected by at each of the reflecting mirrors 51 to 54. The amplified seed laser beam, which is a seed laser beam undergoing the last amplification, passes through the window 13. The amplified beam exiting the housing 11 is the p-polarized beam and, therefore, passes through the polarizing mirror 15.

In FIGS. 20 and 21, the seed laser beam is amplified in the excited laser gases, turning around five times. Although the above description is made as to the seed laser beam turning around four times by way of example, the number of times the seed laser beam turns around may be greater than or equal to two.

On the other hand, a laser beam generated and amplified on an optical axis different from the optical axis OA1 in the gas laser amplifier 10D is blocked by the apertures 31 and 33 and thus never exits through the windows 12 and 13.

In the housing 11 of the gas laser amplifier 10D, a laser beam may be generated and propagated along an optical axis coinciding with the optical axis OA1. As described above, the optical resonator 43 outside the housing 11 is defined by the partially reflective mirrors 16 and 19. The optical axis OA2 of the optical resonator 43 extends through the partially reflective mirror 16 to the polarizing mirror 14 and then to the polarizing mirror 15, and extends through the partially reflective mirror 19. Between the polarizing mirrors 14 and 15, the optical axis OA2 coincides with the optical axis OA1 and passes through the excited laser gases. The above laser beam, which oscillates within the optical resonator 43 and is polarized to the polarization direction PD2 orthogonal to the polarization direction PD1 of the seed laser beam, is reflected by each of the polarizing mirrors 14 and 15. For this reason, such a laser beam, which is reflected and amplified between the partially reflective mirrors 16 and 19, is reflected by the polarizing mirror 14 or 15, such that the laser beam is separated from the optical axis OA1 outside the housing 11. Upon reaching the partially reflective mirror 16 or 19, the laser beam partly passes through the partially reflective mirror 16 or 19 and is absorbed by the damper 18. This prevents the laser beam oscillating within the optical resonator 43 from being emitted outwardly. A component polarized to the same direction as the seed laser beam is not reflected by the polarizing mirrors 14 and 15 and thus cannot resonate within the optical resonator 43, resulting in no laser oscillation.

A description is provided here of conditions which the reflectances $R_1$ and $R_2$ of the partially reflective mirrors 16 and 19 should meet in order that the gas laser amplifier 10D according to the fourth embodiment operates in the manner as discussed above. Reference is made back to FIGS. 7 to 10 of the first embodiment because the gas laser amplifier 10D operates in the manner as illustrated in FIGS. 7 to 10. In the fourth embodiment, the optical resonator output in FIG. 8 should be construed as a total output of laser beams output from the partially reflective mirrors 16 and 19 of the optical resonator 43 and absorbed by the dampers 18.

During each of the intervals ΔT10 and ΔT12 where the seed laser beam enters and is amplified in the gas laser amplifier 10D, the seed laser beam having thus entered consumes the gain within the gas laser amplifier 10D. As illustrated in FIG. 10, the gain $g_a$ within the gas laser amplifier 10D equals the gain $g_p$ during the amplification of the seed laser beam. In the fourth embodiment, the oscillation threshold gain $g_r$ for the optical resonator 43 is set at a value larger than the gain $g_p$ during the amplification of the seed laser beam. For this reason, the optical resonator 43 does not provide a gain larger than or equal to the oscillation threshold gain $g_r$. As a result, as illustrated in FIG. 8, the laser beam fails to oscillate. In other words, there is no laser beam from the optical resonator 43. Similarly, the oscillation threshold gain $g_s$ for self-oscillation is larger in value than the gain $g_p$ during the amplification of the seed laser beam. As a result, no self-oscillation occurs, as illustrated in FIG. 9.

When the output of the amplified laser beam becomes 0 as in FIG. 7 in the interval ΔT11 during which the seed laser beam does not enter the gas laser amplifier 10D, on the other hand, the gain $g_a$ within the gas laser amplifier 10D becomes the small-signal gain $g_0$, exceeding the oscillation threshold gain $g_r$ for the optical resonator 43, as illustrated in FIG. 10. For this reason, the laser beam oscillates immediately within the optical resonator 43, as illustrated in FIG. 8. Since the oscillation threshold gain $g_r$ for the optical resonator 43 is smaller than the oscillation threshold gain $g_s$ for the self-oscillation, the laser beam oscillates within the optical resonator 43 before the self-oscillation occurs. In other words, no self-oscillation occurs, as illustrated in FIG. 9. The gain $g_a$ within the gas laser amplifier 10D is consumed by the optical resonator 43 and becomes equal to the oscillation threshold gain $g_r$ for the optical resonator 43. As a result, the gain $g_a$ within the gas laser amplifier 10D becomes smaller than the oscillation threshold gain $g_s$ for the self-oscillation, thereby causing no self-oscillation. In other words, the gas laser amplifier 10D according to the fourth embodiment is capable of preventing the self-oscillation. As illustrated in FIG. 8, the laser beam oscillating within the optical resonator 43 partly passes through the partially reflective mirrors 16 and 19 and is absorbed by the dampers 18.

A gain for the seed laser beam to be amplified on the optical path length $L_p$ of the optical axis OA1 of the gas laser amplifier 10D, over which the excited laser gas flows, is given by Equation (1) as in the above description.

The partially reflective mirrors 16 and 19 of the optical resonator 43 have the reflectances $R_1$ and $R_2$, respectively. A gain when the optical resonator 43 causes the oscillation on the optical path length $L_r$ of the optical axis OA2, over which the excited laser gas flows, is given by Equation (10) below:

[Formula 5]

$$g_r L_r = -\frac{1}{2} \ln R_1 R_2 \qquad (10)$$

A condition that should be satisfied in order for the optical resonator 43 to automatically suspend the oscillation when the seed laser beam enters the amplifier is given by Inequality (3). Equations (1) and (10) and Inequality (3) give below Inequality (11) that is a condition which the reflectances $R_1$ and $R_2$ of the partially reflective mirrors 16 and 19 of the optical resonator 43 should satisfy:

[Formula 6]

$$R_1 R_2 < \left(\frac{P_{out}}{P_{in}}\right)^{-2} \qquad (11)$$

For example, the gas laser amplifier 10D assumed to output a 25 kW amplified beam with respect to an input 100 W seed laser beam has an amplification factor of 250. A condition of the reflectances $R_1$ and $R_2$ of the partially reflective mirrors 16 and 19 in this case is given by Inequality (12) below:

$$R_1 R_2 < 16 \times 10^{-6} \qquad (12)$$

A small-signal gain on the optical path length $L_p$ of the optical axis OA1, over which the excited laser gas flows, is given by Equation (6).

For example, assume that the saturation intensity $I_s$ is 200 $W/cm^2$ and the above 100 W laser beam is input, amplified, and output as the 25 kW amplified seed laser beam having a beam diameter $\varphi$ of 30 mm. Under this condition, the small-signal gain on the optical path length $L_p$ of the optical axis OA1, over which the excited laser gas flows, is given by Equation (7), The self-oscillation is caused by diffracted light or reflection from some component external to the gas laser amplifier 10D or from the internal component such as the aperture 31, 32, or 33. For this reason, self-oscillating light provides a very low feedback rate, and, in most cases, an oscillation threshold for the self-oscillation is substantially the same as the small-signal gain. Thus, a condition that should be satisfied in order to cause the oscillation within the optical resonator 43 before the generation of the self-oscillating light is given by Inequality (8).

Substituting Equations (10) and (7) into Inequality (8) gives below Inequality (13) that is a condition of the reflectances $R_1$ and $R_2$ of the partially reflective mirrors 16 and 19 of the optical resonator 43:

$$R_1 R_2 < 7 \times 10^{-21} \qquad (13)$$

Setting the product of the reflectance $R_1$ of the partially reflective mirror 16 and the reflectance $R_2$ of the partially reflective mirror 19 larger than $7 \times 10^{-21}$ and smaller than $16 \times 10^{-4}$ on the basis of Inequalities (12) and (13) enables the above-described prevention of self-oscillation within the gas laser amplifier 10D.

In the fourth embodiment described above, the optical resonator 43 is placed in the gas laser amplifier 10D, and the reflectances $R_1$ and $R_2$ of the partially reflective mirrors 16 and 19 of the optical resonator 43 are appropriately set. As a result, the oscillation threshold gain for the laser beam within the optical resonator 43 becomes larger than the gain during the amplification of the seed laser beam, which enters the amplifier from outside, and smaller than the threshold gain for the self-oscillation. Consequently, it becomes possible to prevent the self-oscillation without use of a device that varies loss from the optical resonator 43 over time.

In FIG. 20, the polarization direction POI of the seed laser beam is the X-directions, which are the direction of the gas flow between the discharge electrodes 21A and 22A and the direction of the gas flow between the discharge electrodes 218 and 22B; however, the polarization direction PD1 of the seed laser beam may be the Y-directions along discharge gap lengths, and the polarization direction PD2 of the laser beam generated within the optical resonator 43 may be the X-directions orthogonal to the polarization direction PD1. In other words, the polarizing mirrors 14 and 15 may be those which reflect the p-polarized beam and transmit the s-polarized beam.

In FIG. 20, the optical resonator 43 is placed outside the housing 11; however, the polarizing mirror 14, the partially reflective mirror 16, and the damper 18 may be placed inside the housing 11, and/or the polarizing mirror 15, the partially reflective mirror 19, and the damper 13 may be placed inside the housing 11.

In FIG. 20, the beam that reciprocates within the optical resonator 43 is reflected by the polarizing mirrors 14 and 15 in the directions along the gas flow between the discharge electrodes 21A and 22A and the gas flow between the discharge electrodes 21B and 22B, that is to say, in the X-directions; however, the beam that reciprocates within the optical resonator 43 may be reflected in directions along the discharge gap lengths, that is to say, in the Y-directions. The gas laser amplifier 10D in FIG. 20 has a four-pass configuration that allows the seed laser beam to pass through the discharge spaces four times on the optical axis OA1; however, the gas laser amplifier 10D may have a single-pass configuration that, without the reflecting mirrors 51 to 54, allows the seed laser beam to pass through the discharge spaces 23A and 23B only once as in the first embodiment, or a configuration that allows the seed laser beam to pass through the discharge spaces 23A and 23B multiple times other than four times.

The fourth embodiment can also provide the same effects as the third embodiment.

Fifth Embodiment

Figure 22:
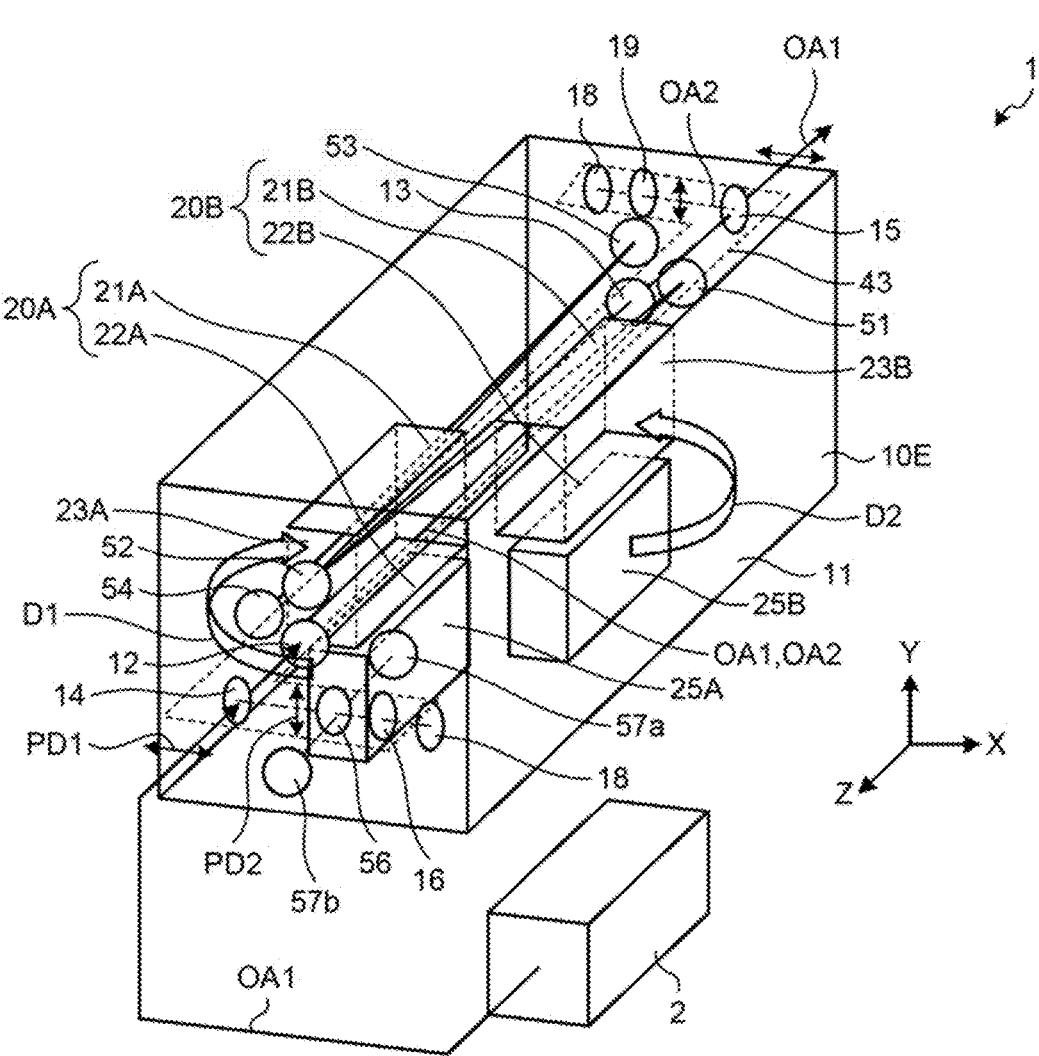
FIG. 22 is a perspective view schematically illustrating a configuration example of a gas laser apparatus that includes a gas laser amplifier according to a fifth embodiment.
Figure 23:
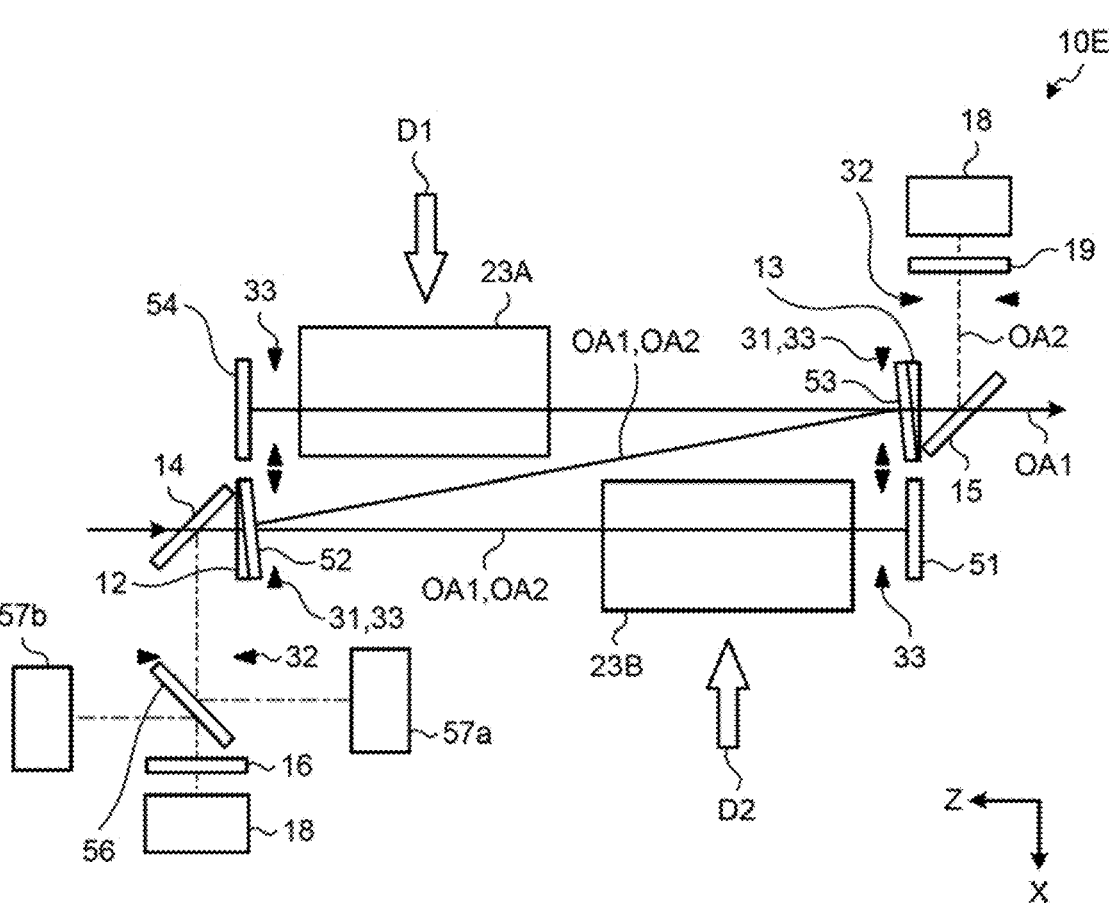
FIG. 23 illustrates an interior of the gas laser amplifier of FIG. 22 as viewed in a Y-direction.

FIG. 22 is a perspective view schematically illustrating a configuration example of a gas laser apparatus that includes a gas laser amplifier according to the fifth embodiment. FIG. 23 illustrates an interior of the gas laser amplifier of FIG. 22 as viewed in a Y-direction. A description is hereinafter provided of difference from the first through fourth embodiments. Parts identical with those in the first through fourth embodiments have the same reference characters and are not described.

The gas laser amplifier 10E is the gas laser amplifier 10D according to the fourth embodiment with a beam splitter 56 and dampers 57a and 57b added. The beam splitter 56 is disposed between the partially reflective mirror 16 and the polarizing mirror 14. The damper 57a absorbs a laser beam that has been incident on the beam splitter 56 from the housing 11 and reflected by the beam splitter 56. The damper 57b absorbs a laser beam that has been incident on the beam splitter 56 from the partially reflective mirror 16 and reflected by the beam splitter 56. The other elements of the gas laser amplifier 10E are the same as those of the fourth embodiment.

The gas laser amplifier 10E according to the fifth embodiment operates similarly to that of the fourth embodiment. For the gas laser amplifier 10E, however, a laser beam amplified by the optical resonator 43 is partly reflected by the beam splitter 56 and absorbed by the damper 57a when that amplified laser beam is propagated from the window 12 toward the partially reflective mirror 16. A portion of a laser beam passes through the partially reflective mirror 16 and is absorbed by the damper 18, while the remaining portion of the laser beam is reflected by the partially reflective mirror 16 and propagated toward the partially reflective mirror 19 along the optical axis OA2. Then, a portion of this reflected laser beam is reflected by the beam splitter 56 and absorbed by the damper 57b.

A description is provided here of conditions which the reflectances $R_1$ and $R_2$ of the partially reflective mirrors 16 and 19 and a transmittance T of the beam splitter 56 should meet in order that the gas laser amplifier 10E according to the fifth embodiment operates in the manner as discussed above. Reference is made back to FIGS. 7 to 10 of the first embodiment because the gas laser amplifier 10E operates in the manner as illustrated in FIGS. 7 to 10. In the fifth embodiment, the optical resonator output in FIG. 8 should be construed as a total of an output of laser beams output from the partially reflective mirrors 16 and 19 of the optical resonator 43 and absorbed by the dampers 18 and an output of laser beams separated by the beam splitter 56 and absorbed by the dampers 57a and 57b.

During each of the intervals ΔT10 and ΔT12 where a seed laser beam enters and is amplified in the gas laser amplifier 10E, the seed laser beam consumes the gain within the gas laser amplifier 105. As illustrated in FIG. 10, the gain $g_a$ within the gas laser amplifier 10E equals the gain $g_p$ during the amplification of the seed laser beam. In the fifth embodiment, the oscillation threshold gain $g_r$ for the optical resonator 43 defined by the partially reflective mirrors 16 and 19 is set at a value larger than the gain $g_p$ during the amplification of the seed laser beam. For this reason, the optical resonator 43 does not provide a gain larger than or equal to the oscillation threshold gain $g_r$. As a result, as illustrated in FIG. 8, the laser beam fails to oscillate. In other words, there is no laser beam from the optical resonator 43. Similarly, the oscillation threshold gain $g_s$ for self-oscillation is larger in value than the gain $g_p$ during the amplification of the seed laser beam. As a result, no self-oscillation occurs, as illustrated in FIG. 9.

When the output of the amplified laser beam becomes 0 as in FIG. 7 in the interval ΔT11 during which the seed laser beam does not enter the gas laser amplifier 10E, on the other hand, the gain $g_a$ within the gas laser amplifier 10E becomes the small-signal gain $g_0$, exceeding the oscillation threshold gain $g_r$ for the optical resonator 43, as illustrated in FIG. 10. For this reason, the laser beam oscillates immediately within the optical resonator 43, as illustrated in FIG. 8. Since the oscillation threshold gain $g_r$ for the optical resonator 43 is smaller than the oscillation threshold gain $g_s$ for the self-oscillation, the laser beam oscillates within the optical resonator 43 before the self-oscillation occurs. In other words, no self-oscillation occurs, as illustrated in FIG. 9. The gain $g_a$ within the gas laser amplifier 10E is consumed by the optical resonator 43 and becomes equal to the oscillation threshold gain $g_r$ for the optical resonator 43. As a result, the gain $g_a$ within the gas laser amplifier 10E becomes smaller than the oscillation threshold gain $g_s$ for the self-oscillation, thereby causing no self-oscillation. In other words, the gas laser amplifier 10E according to the fifth embodiment is capable of preventing the self-oscillation. As FIG. 8 illustrates, the laser beam oscillating within the optical resonator 43 partly passes through the partially reflective mirrors 16 and 19 or is reflected by the beam splitter 56, and is absorbed by the dampers 18, 57a, and 57b.

A gain for the seed laser beam to be amplified on the optical path length $L_p$ of the optical axis OA1, over which the excited laser gas flows, is given by Equation (1) as in the above description.

The partially reflective mirrors 16 and 19 of the optical resonator 43 have the reflectances $R_1$ and $R_2$, respectively, and the beam splitter 56 has the transmittance T. A gain when the optical resonator 43 causes the oscillation on the optical path length $L_r$ of the optical axis OA2, over which the excited laser gas flows, is given by Equation (14) below:

[Formula 7]

$$g_r L_r = -\frac{1}{2}\ln R_1 R_2 T^2 \tag{14}$$

A condition that should be satisfied in order for the optical resonator 43 to automatically suspend the oscillation when the seed laser beam enters the amplifier is given by Inequality (3). Equations (1) and (14) and Inequality (3) give below Inequality (15) that is a condition which the reflectances $R_1$ and $R_2$ of the partially reflective mirrors 16 and 19 of the optical resonator 43 and the transmittance T of the beam splitter 56 should satisfy:

[Formula 8]

$$R_1 R_2 T^2 < \left(\frac{P_{out}}{P_{in}}\right)^{-2} \tag{15}$$

For example, the gas laser amplifier 10E assumed to output a 25 kw amplified beam with respect to an input 100 W seed laser beam has an amplification factor of 250. A condition of the reflectances $R_1$ and $R_2$ of the partially reflective mirrors 16 and 19 and the transmittance T of the beam splitter 56 in this case is given by Inequality (16) below:

$$R_1 R_2 T^2 < 16 \times 10^{-6} \qquad (16)$$

A small-signal gain on the optical path length $L_p$ of the optical axis OA1, over which the excited laser gas flows, is given by Equation (6).

For example, assume that the saturation intensity $I_s$ is 200 W/cm$^2$ and the above 100 W laser beam is input, amplified, and output as the 25 kW amplified seed laser beam having a beam diameter φ of 30 mm. Under this condition, the small-signal gain on the optical path length $L_p$ of the optical axis OA1, over which the excited laser gas flows, is given by Equation (7).

The self-oscillation is caused by diffracted light or reflection from some component external to the gas laser amplifier 10E or from the internal component such as the aperture 31, 32, or 33. For this reason, self-oscillating light provides a very low feedback rate, and, in most cases, an oscillation threshold for the self-oscillation is substantially the same as the small-signal gain. Thus, a condition that should be satisfied in order to cause the oscillation within the optical resonator 43 before the generation of the self-oscillating light is given by Inequality (8).

Substituting Equations (14) and (7) into Inequality (8) gives below Inequality (17) that is a contion of The reflectances $R_1$ and $R_2$ of the partially reflective mirrors 16 and 19 of the optical resonator 43 and the transmittance T of the beam splitter 56:

$$R_1 R_2 T^2 > 7 \times 10^{-21} \qquad (17)$$

Setting the product of the reflectance $R_1$ of the partially reflective mirror 16, the reflectance $R_2$ of the partially reflective mirror 19, and the transmittance T squared of the beam splitter 56 larger than $7 \times 10^{-21}$ and smaller than $16 \times 10^{-6}$ on the basis of Inequalities (16) and (17) enables the above-described prevention of self-oscillation within the gas laser amplifier 10E.

In other words, the use of the beam splitter 56 increases the degree of freedom of selection of the reflectances $R_1$ and $R_2$ of the partially reflective mirrors 16 and 19 and the transmittance T of the beam splitter 56, as compared to the fourth embodiment.

In the fifth embodiment described above, the optical resonator 43 is placed in the gas laser amplifier 10E, and the reflectances $R_1$ and $R_2$ of the partially reflective mirrors 16 and 19 of the optical resonator 43 and the transmittance T of the beam splitter 56 are appropriately set. As a result, the oscillation threshold gain for the laser beam within the optical resonator 43 becomes larger than the gain during the amplification of the seed laser beam, which enters the amplifier from outside, and lower than the threshold gain for the self-oscillation. Consequently, it becomes possible to prevent the self-oscillation without use of a device that varies loss from the optical resonator 43 over time.

In FIG. 22, the polarization direction PD1 of the seed laser beam is X-directions that are the direction of the gas flow between the discharge electrodes 21A and 22A and the direction of the gas flow between the discharge electrodes 21B and 22B; however, the polarization direction PD1 of the seed laser beam may be the Y-directions along discharge gap lengths, and the polarization direction PD2 of the laser beam generated within the optical resonator 43 may be the X-directions orthogonal to the polarization direction PD1. In other words, the polarizing mirrors 14 and 15 may be those which reflect a p-polarized beam and transmit an s-polarized beam.

In FIG. 22, the optical resonator 43 is placed outside the housing 11; however, the polarizing mirror 14, the beam splitter 56, the partially reflective mirror 16, and the dampers 18, 57a, and 57b may be placed inside the housing 11, and/or the polarizing mirror 15, the partially reflective mirror 19, and the damper 18 may be placed inside the housing 11.

In FIG. 22, the beam that reciprocates within the optical resonator 43 is reflected by the polarizing mirrors 14 and 15 in the directions along the gas flow between the discharge electrodes 21A and 22A and the gas flow between the discharge electrodes 21B and 22B, that is to say, in the X-directions; however, the beam that reciprocates within the optical resonator 43 may be reflected in directions along the discharge gap lengths, that is to say, in the Y-directions. While the amplifier in FIG. 22 has a four-pass configuration that allows the seed laser beam to pass through the discharge spaces four times on the optical axis OA1, the amplifier may have a single-pass configuration that, without the reflecting mirrors 51 to 54, allows the seed laser beam to pass through the discharge spaces 23A and 23B only once as in the first embodiment or a configuration that allows the seed laser beam to pass through the discharge spaces 23A and 23B multiple times other than four times. While FIG. 22 illustrates the configuration with the single beam splitter 56, a plurality of the beam splitters 56 may be provided on the optical axis OA2 between the polarizing mirror 14 and the partially reflective mirror 16 or on the optical axis OA2 between the polarizing mirror 15 and the partially reflective mirror 19.

The fifth embodiment can also provide the same effects as the third embodiment.

Sixth Embodiment

Figure 24:
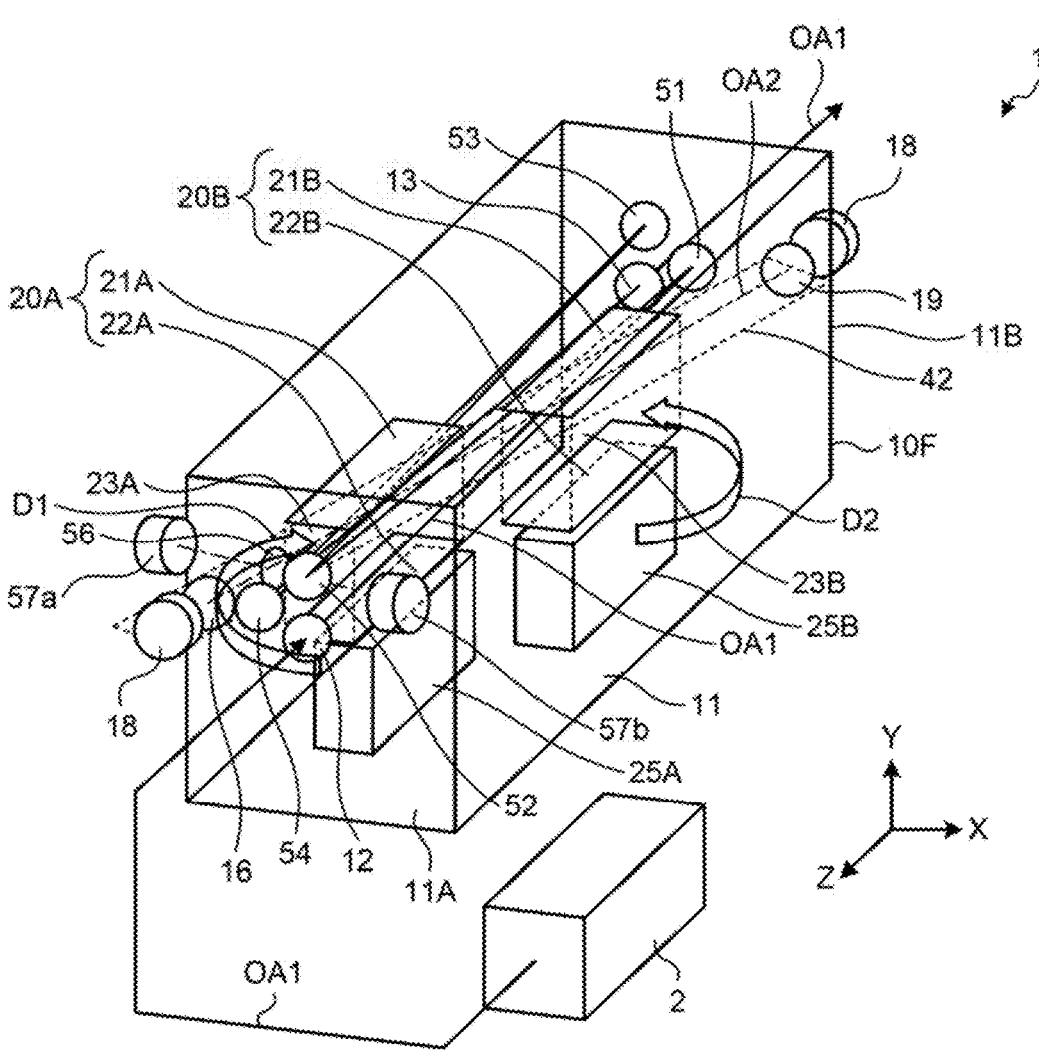
FIG. 24 is a perspective view schematically illustrating a configuration example of a gas laser apparatus that includes a gas laser amplifier according to a sixth embodiment.
Figure 25:
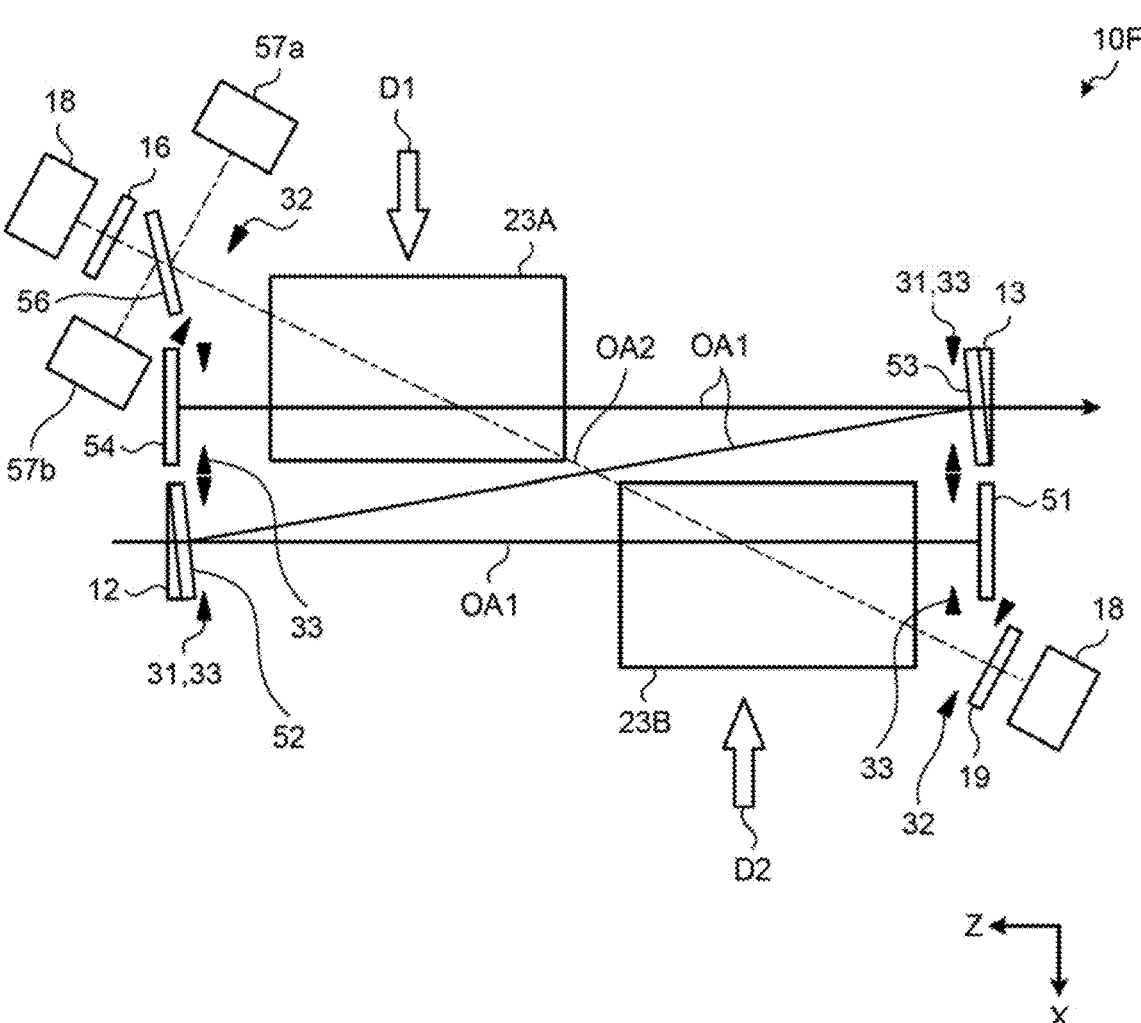
FIG. 25 illustrates an interior of the gas laser amplifier of FIG. 24 as viewed in a Y-direction.

FIG. 24 is a perspective view schematically illustrating a configuration example of a gas laser apparatus that includes a gas laser amplifier according to the sixth embodiment. FIG. 25 illustrates an interior of the gas laser amplifier of FIG. 24 as viewed in a Y-direction. A description is hereinafter provided of difference from the first through fifth embodiments. Parts identical with those in the first through fifth embodiments have the same reference characters and are not described.

The gas laser amplifier 10F is the gas laser amplifier 10C according to the third embodiment with the beam splitter 56 and the dampers 57a and 57b added. The beam splitter 56 is disposed between the partially reflective mirror 16 and the aperture 32. The damper 57a absorbs a laser beam that has been incident on the beam splitter 56 from the housing 11 and reflected by the beam splitter 56. The damper 57b absorbs a laser beam that has been incident on the beam splitter 56 from the partially reflective mirror 16 and reflected by the beam splitter 56. The other elements of the gas laser amplifier 10F are the same as those of the third embodiment.

The gas laser amplifier 10F according to the sixth embodiment operates similarly to that of the third embodiment. For the gas laser amplifier 10F, however, a laser beam amplified by the optical resonator 42 is partly reflected by the beam splitter 56 and absorbed by the damper 57a when that amplified lease beam is propagated from the partially reflective mirror 19 toward the partially reflective mirror 16. A portion of a laser beam passes through the partially reflective mirror 16 and is absorbed by the damper 18, while the remaining portion of the laser beam is reflected by the partially reflective mirror 16 and is propagated toward the partially reflective mirror 19 along the optical axis OA2. Then, a portion of this reflected laser beam is reflected by the beam splitter 56 and absorbed by the damper 57b.

The respective reflectances $R_1$ and $R_2$ of the partially reflective mirrors 16 and 19 of the optical resonator 42 and the transmittance T of the beam splitter 56 are set such that the oscillation threshold gain $g_r$ for the optical resonator 42 satisfies conditions below. Reference is made back to FIGS. 14 to 17 of the second embodiment because the gas laser amplifier 10F according to the sixth embodiment operates in the manner as illustrated in FIGS. 14 to 17. In the sixth embodiment, the optical resonator output power in FIG. 15 should be construed as a total output of laser beams output from the partially reflective mirrors 16 and 19 of the optical resonator 42 and absorbed by the dampers 18 and laser beams reflected by the beam splitter 56 and absorbed by the dampers 57a and 57b.

During each of the intervals ΔT10 and ΔT12, a seed laser beam enters and amplified in the gas laser amplifier 10F. In this state, the seed laser beam that has entered the amplifier consumes the gain within the gas laser amplifier 10F as in the above description. During this amplification, a gain on the optical axis OA2 of the optical resonator 42 is $g_p'$.

In the sixth embodiment, the oscillation threshold gain $g_r$ for the optical resonator 42 defined by the partially reflective mirrors 16 and 19 is set at a value larger than the gain $g_p'$ on the optical axis OA2 during the amplification of laser beam. Therefore, while the seed laser beam is amplified and exits through the window 13, the optical resonator 42 does not provide a gain larger than or equal to the oscillation threshold gain $g_r$. As a result, as illustrated in FIG. 15, the laser beam fails to oscillate. In other words, there is no laser beam from the optical resonator 42. Similarly, the oscillation threshold gain $g_s$ for self-oscillation is larger in value than the gain $g_p$ on the optical axis OA1 during the amplification of the laser beam. As a result, no self-oscillation occurs, as illustrated in FIG. 16.

On the other hand, during the interval ΔT11, the seed laser beam does not enter the gas laser amplifier 10F. When the output of the amplified laser beam becomes 0 in the interval ΔT11 as in FIG. 14, the gain $g_a$ within the gas laser amplifier 10F exceeds the oscillation threshold gain $g_r$ for the optical resonator 42, as illustrated in FIG. 17. For this reason, the laser beam oscillates immediately within the optical resonator 42, as illustrated in FIG. 15. Since the oscillation threshold gain $g_r$ for the optical resonator 42 is smaller than the oscillation threshold gain $g_s$ for the self-oscillation, the laser beam oscillates within the optical resonator 42 before the self-oscillation occurs. In other words, no self-oscillation occurs, as illustrated in FIG. 16. The gain $g_a$ on the optical axis OA1 within the gas laser amplifier 10F is consumed by the optical resonator 42, and becomes equal to the gain $g_r'$ on the optical axis OA1 during the oscillation within the optical resonator 42. As a result, the gain $g_a$ within the gas laser amplifier 10F becomes smaller than the oscillation threshold gain $g_s$ for the self-oscillation, thereby causing no self-oscillation. In other words, the gas laser amplifier 10F according to the sixth embodiment is capable of preventing the self-oscillation. As FIG. 15 illustrates, the laser beam oscillating within the optical resonator 42 partly passes through the partially reflective mirrors 16 and 19 and is absorbed by the dampers 18. Moreover, the laser beam oscillating within the optical resonator 42 is partly reflected by the beam splitter 56 and absorbed by the dampers 57a and 57b.

As in the fifth embodiment, the degree of freedom of selection of the reflectances $R_1$ and $R_2$ of the partially reflective mirrors 16 and 19 and the transmittance T of the beam splitter 56 is greater than that in the third embodiment.

The sixth embodiment can also provide the same effects as the third embodiment.

Seventh Embodiment

Figure 26:
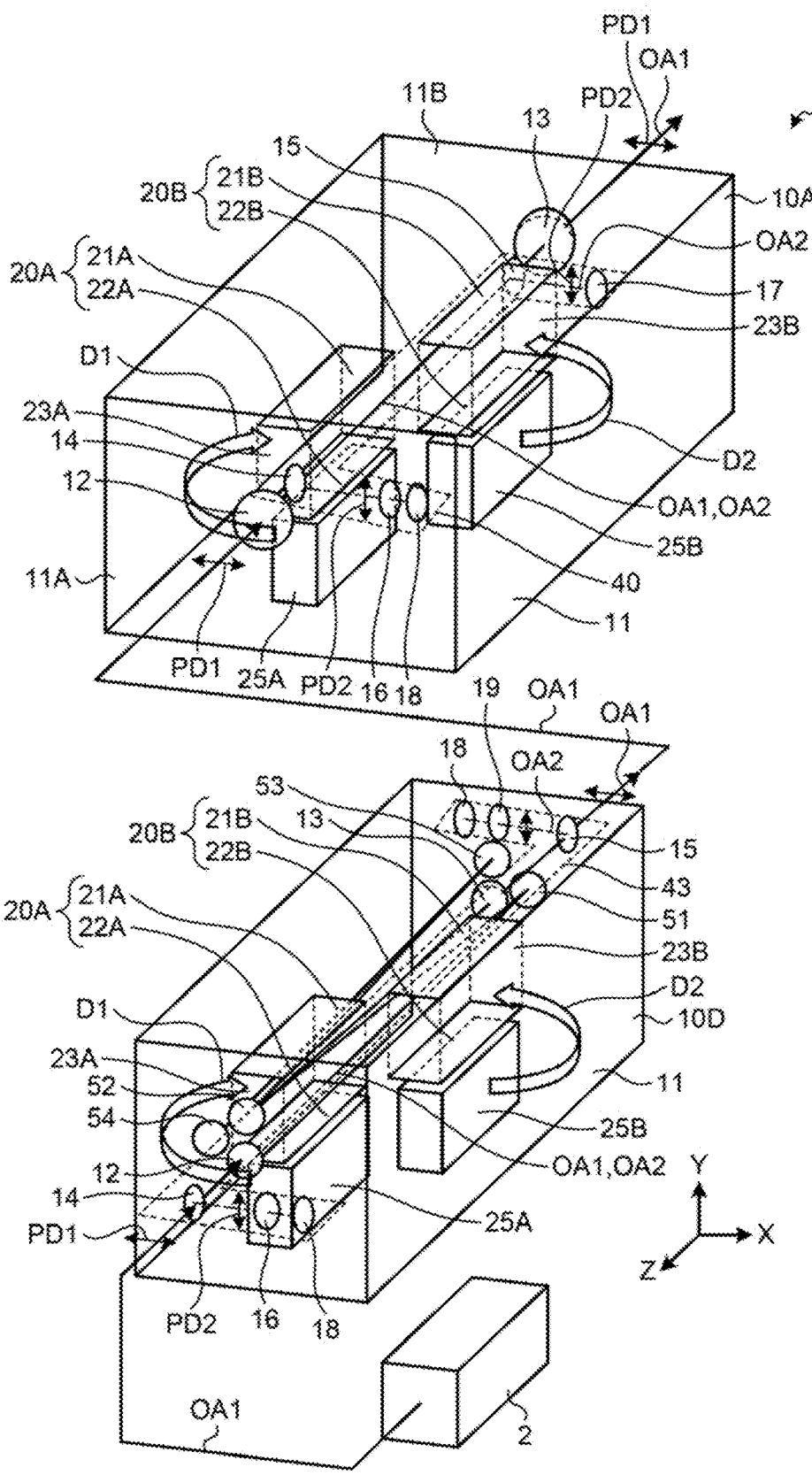
FIG. 26 is an exploded perspective view schematically illustrating a configuration example of a gas laser apparatus according to a seventh embodiment that includes the gas laser amplifiers.

FIG. 26 is an exploded perspective view schematically illustrating a configuration example of a gas laser apparatus according to the seventh embodiment that includes the gas laser amplifiers. The gas laser apparatus 1 includes the laser beam source 2, the gas laser amplifier 10D according to the fourth embodiment, and the gas laser amplifier 10A according to the first embodiment. The gas laser amplifier 10D and the gas laser amplifier 10A are coupled to each other such that a seed laser beam from the laser beam source 2 enters the gas laser amplifier 10D according to the fourth embodiment through the window 12 and an amplified beam emitted from the gas laser amplifier 10D enters the gas laser amplifier 10A according to the first embodiment through the window 12. For the gas laser apparatus 1, in other words, the gas laser amplifier 10D having the reflecting mirrors 51 to 54 configured to allow the seed laser beam from the laser beam source 2 to be reflected turning around within the housing 11 is disposed at a front stage. Disposed at a rear stage following the first stage is the gas laser amplifier 10A of in its single-pass configuration providing no reflecting mirrors that reflects the seed beam. In one example, the laser beam source 2 and the gas laser amplifier 10D are connected by an optical fiber, and the gas laser amplifier 10D and the gas laser amplifier 10A are connected by an optical fiber.

In this gas laser apparatus 1, the seed laser beam emitted from the laser beam source 2 enters the housing 11 of the gas laser amplifier 10D through the window 12 along the optical axis OA1 and passes through an excited laser gas, such that the seed laser beam is amplified. Since the optical axis OA1 turns around multiple times within the housing 11 of the gas laser amplifier 10D, the seed laser beam is amplified multiple times. The amplified seed laser beam exits the housing 11 of the gas laser amplifier 10D through the window 13 and is incident on the window 12 of the downstream gas laser amplifier 10A. Through the window 12, the amplified beam enters the housing 11 of the gas laser amplifier 10A, is amplified further by passing through an excited laser gas, and exits through the window 13.

A description is provided here of conditions of the reflectances $R_1$ and $R_2$ of the partially reflective mirrors 16 and 19 of the gas laser amplifier 10D according to the seventh embodiment and reflectances $R_3$ and $R_4$ of the partially reflective mirror 16 and the totally reflective mirror 17 of the gas laser amplifier 10A according to the seventh embodiment.

Figure 27:
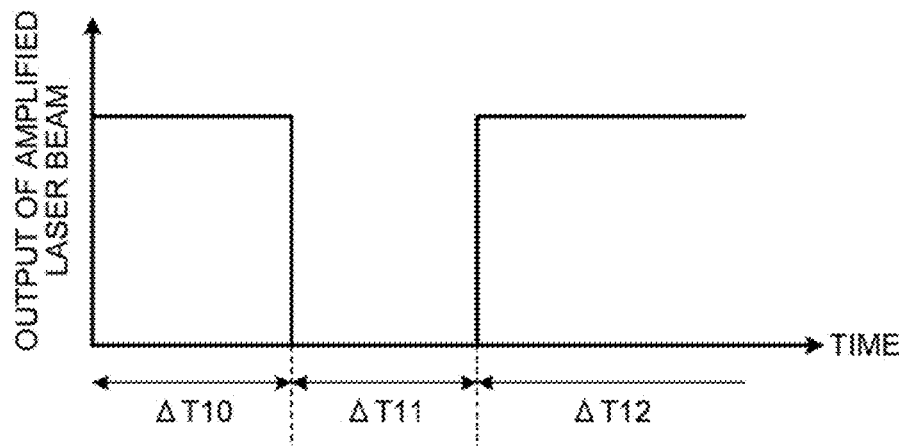
FIG. 27 illustrates an example of how an output of a laser beam amplified by the gas laser amplifiers according to the seventh embodiment varies with time.
Figure 28:
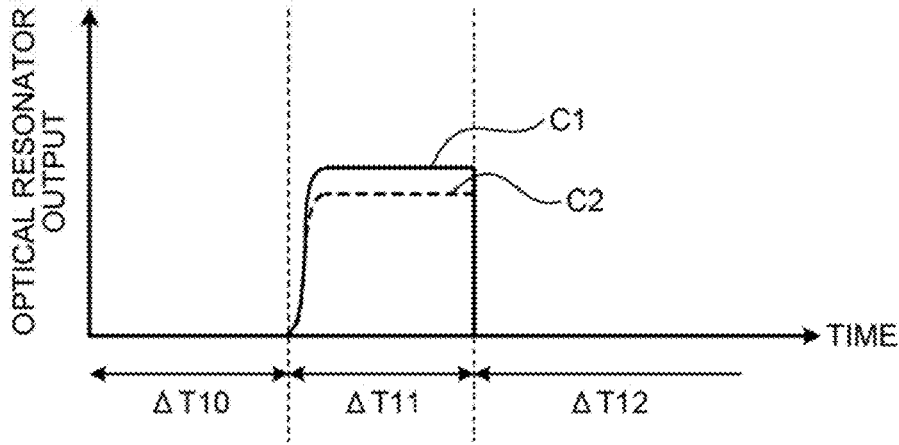
FIG. 28 illustrates an example of how optical resonator output in each of the gas laser amplifiers according to the seventh embodiment varies with time.
Figures 29, 30:
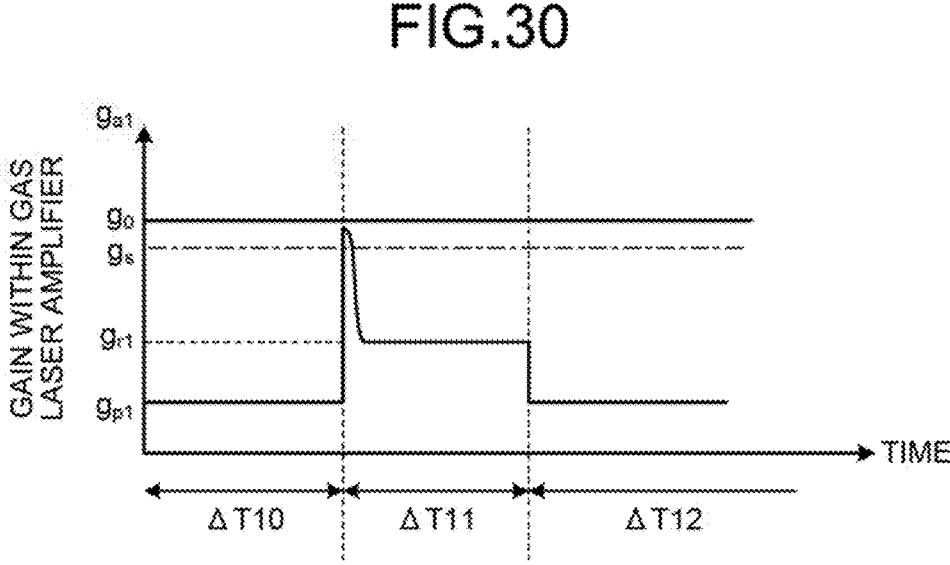
FIG. 29 illustrates an example of how self-oscillating output in the gas laser amplifiers according to the seventh embodiment varies with time.
FIG. 30 illustrates an example of how a gain within the first-stage gas laser amplifier according to the seventh embodiment varies with time.
Figure 31:
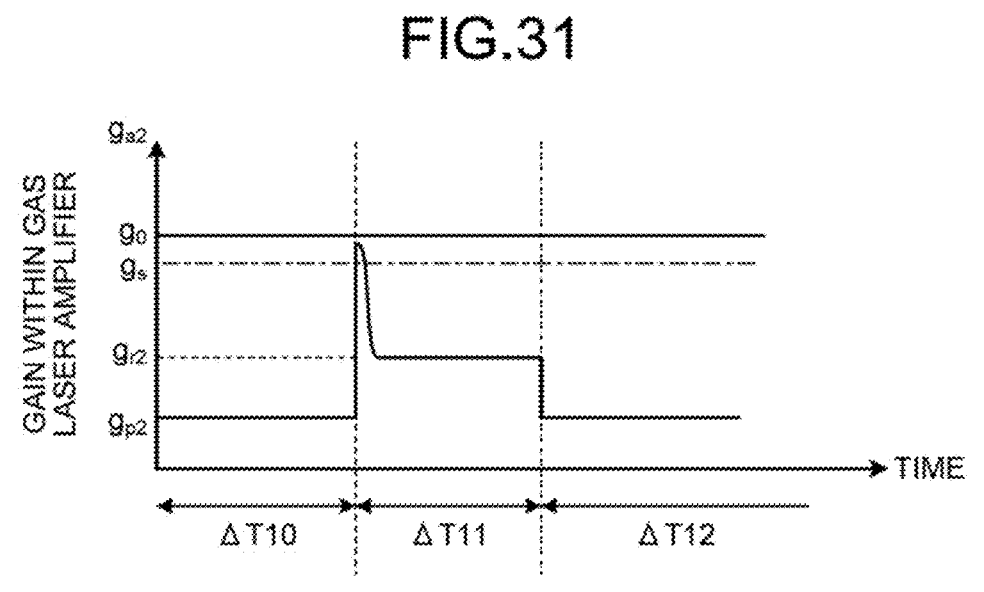

FIG. 27 illustrates an example of how an output of a laser beam amplified by the gas laser amplifiers according to the seventh embodiment varies with time. FIG. 28 illustrates an example of how an optical resonator output in each of the gas laser amplifiers according to the seventh embodiment varies with time. FIG. 29 illustrates an example of how a self-oscillating output in the gas laser amplifiers according to the seventh embodiment varies with time. FIG. 30 illustrates an example of how a gain within the first-stage gas laser amplifier according to the seventh embodiment varies with time. FIG. 31 illustrates an example of how a gain within the second-stage gas laser amplifier according to the seventh embodiment varies with time. In each of these drawings, a horizontal axis represents time.

The output of the amplified laser beam of FIG. 27 represents the output of the amplified seed laser beam having passed through the two coupled gas laser amplifiers 10D and 10A along the optical axis OA1. The optical resonator output in FIG. 28 refers to outputs of laser beams output from the partially reflective mirrors 16 and 19 of the optical resonators 40, 43 in the gas laser amplifiers 10D, 10A coupled together along the optical axis OA1, and absorbed by the dampers 18. A curve C1 represents the output of the laser beams from the optical resonator 43 in the first-stage gas laser amplifier 10D, and a curve C2 represents the output of the laser beam from the optical resonator 40 in the second-stage gas laser amplifier 10A. FIG. 30 illustrates a gain $g_{a1}$ within the first-stage gas laser amplifier 10D, and FIG. 31 illustrates a gain $g_{a2}$ within the second-stage gas laser amplifier 10A. In FIGS. 30 and 31, $g_{r1}$ and $g_{r2}$ represent an oscillation threshold gain for the optical resonator 43 in the first-stage gas laser amplifier 10D and an oscillation threshold gain for the optical resonator 40 in the second-stage gas laser amplifier 10A, respectively. $g_{p1}$ and $g_{p2}$ represent a gain during the amplification of the seed laser beam within the first-stage gas laser amplifier 10D and a gain during the amplification of the seed laser beam within the second-stage gas laser amplifier 10A, respectively.

During each of the intervals $\Delta T10$ and $\Delta T12$, the seed laser beam enters and is amplified in the gas laser amplifiers 10D and 10A. In this state, the seed laser beam having thus entered consumes the gains within the gas laser amplifiers 10D and 10A, as described above. Accordingly, the gains $g_{a1}$ and $g_{a2}$ within the first-stage and second-stage gas laser amplifiers 10D and 10A equal the gains $g_{p1}$ and $g_{p2}$ during the amplification of the seed laser beam, respectively, as illustrated in FIGS. 30 and 31. In the seventh embodiment, the oscillation threshold gain $g_{r1}$ for the optical resonator 43 of the first-stage gas laser amplifier 10D is set at a value larger than the gain $g_{p1}$ during the amplification of the laser beam. The oscillation threshold gain $g_{r2}$ for the optical resonator 40 of the second-stage gas laser amplifier 10A is set at a value larger than the gain $g_{p2}$ during the amplification of the laser beam. For this reason, each of the optical resonators 43 and 40 of the gas laser amplifiers 10D and 10A does not provide a gain larger than or equal to the oscillation threshold gains $g_{r1}$, $g_{r2}$. As a result, as illustrated in FIG. 23, a laser beam fails to oscillate. In other words, there is no laser beam from each of the optical resonators 43 and 40. Similarly, the oscillation threshold gain $g_s$ for self-oscillation is larger in value than the gains $g_{p1}$ and $g_{p2}$ during the amplification of the seed laser beam. As a result, no self-oscillation occurs, as illustrated in FIG. 29.

On the other hand, during the interval $\Delta T11$, the seed laser beam does not enter the gas laser amplifiers 10D and 10A. When the output of the amplified laser beam becomes 0 as in FIG. 27 in the interval $\Delta T11$, each of the gains $g_{a1}$ and $g_{a2}$ within the gas laser amplifiers 10D and 10A becomes the small-signal gain $g_0$, exceeding the corresponding one of the oscillation threshold gains $g_{r1}$ and $g_{r2}$ for the optical resonators 43 and 40 of the gas laser amplifiers 10D and 10A, as illustrated in FIGS. 30 and 31. For this reason, as indicated by curves C1 and C2 of FIG. 28, the laser beam oscillates immediately within each of the optical resonators 43 and 40 of the gas laser amplifiers 10D and 10A. Since the oscillation threshold gains $g_{r1}$ and $g_{r2}$ for the optical resonators 43 and 40 of the gas laser amplifiers 10D and 10A are both smaller than the oscillation threshold gain $g_a$ for the self-oscillation, the laser beam oscillates within each of the optical resonators 43 and 40 of the gas laser amplifiers 10D and 10A before the self-oscillation occurs. In other words, no self-oscillation occurs, as illustrated in FIG. 29. The gains $g_{a1}$ and $g_{a2}$ within the gas laser amplifiers 10D and 10A are consumed by the optical resonators 43 and 40 and become equal to the oscillation threshold gains $g_{r1}$ and $g_{r2}$ for the optical resonators 43 and 40 of the gas laser amplifiers 10D and 10A, respectively. As a result, the gains $g_{a1}$ and $g_{a2}$ within the gas laser amplifiers 10D and 10A both become smaller than the oscillation threshold gain $g_s$ for the self-oscillation, thereby causing no self-oscillations. In other words, the gas laser apparatus 1 according to the seventh embodiment is capable of preventing the self-oscillation. As illustrated in FIG. 28, the laser beam oscillating within the optical resonators 43 and 40 partly passes through the partially reflective mirror 16, 19 and is absorbed by the dampers 18.

Let $g_{p1}$ be a residual gain, that is to say, a gain per unit length during the amplification of the seed laser beam entering the first-stage gas laser amplifier 10D on the optical axis OA1. An output of the seed laser beam entering the first-stage gas laser amplifier 10D is represented by P1$_{in}$, and an output of the amplified seed laser beam (amplified beam) exiting the first-stage gas laser amplifier 10D is represented by P1$_{out}$. The optical axis OA1 includes an optical path length $L_{p1}$ over which the excited laser gas in the first-stage gas laser amplifier 10D flows, and a gain for the seed laser beam to be amplified along the optical path length $I_{p1}$ of the optical axis OA1 is given by Equation (18) below:

[Formula 9]

$$g_{p1}L_{p1} = \ln\left(\frac{P1_{out}}{p1_{in}}\right) \tag{18}$$

Let the reflectances of the partially reflective mirrors 16 and 19 of the first-stage optical resonator 43 respectively be $R_1$ and $R_2$, and let the oscillation threshold gain $g_{r1}$ be a gain per unit length when the optical resonator 43 causes the oscillation. The optical axis OA2 includes an optical path length $L_{r1}$ over which the excited laser gas flows, and a gain for the laser beam generated within the optical resonator 43 to be amplified along the optical path length $L_{r1}$ of the optical axis OA2 is given by Equation (19) below:

[Formula 10]

$$g_{r1}L_{r1} = -\frac{1}{2}\ln R_1 R_2 \tag{19}$$

A condition that should be satisfied in order for the optical resonator 43 to automatically suspend the oscillation when the seed laser beam enters the first-stage gas laser amplifier 10D is given by Inequality (20) below:

$$g_{p1}L_{p1} < g_{r1}L_{r1} \tag{20}$$

Equations (18) and (19) and Inequality (20) give below Inequality (21) that is a condition which the reflectances $R_1$ and $R_2$ of the partially reflective mirrors 16 and 19 of the optical resonator 43 should satisfy:

[Formula 11]

$$R_1 R_2 < \left(\frac{P1_{out}}{P1_{in}}\right)^{-2} \tag{21}$$

For example, the gas laser amplifier 10D assumed to output a 10 kW amplified beam with respect to an input seed laser beam of 100 W or less has an amplification factor of 100 or more. A condition of the reflectances $R_1$ and $R_2$ of the partially reflective mirrors 16 and 19 in this case is given by Inequality (22) below:

$$R_1 R_2 < 100 \times 10^{-6} \tag{22}$$

On the other hand, let beam intensity of the seed laser beam entering be $I1_{in}$, let beam intensity of the amplified beam from the first-stage gas laser amplifier 10D be $I1_{out}$, let saturation intensity be $I_s$, and let the small-signal gain of the first-stage gas laser amplifier 10D be $g_{01}$. A small-signal gain along the optical path length $L_{p1}$ of the optical axis OA1, over which the excited laser gas flows, is given by Equation (23) below:

[Formula 12]

$$g_{01} L_{p1} = \ln\left(\frac{I1_{out}}{I1_{in}}\right) + \left(\frac{I1_{out}}{I_s} - \frac{I1_{in}}{I_s}\right) \tag{23}$$

For example, assume that the saturation intensity $I_s$ is 200 W/cm$^2$ and that the above 100 W laser beam is input, amplified in the first-stage gas laser amplifier 10D, and output as the 10 kW amplified seed laser beam having a beam diameter φ of 15 mm. Under such a condition, the small-signal gain along the optical path length $L_{p1}$ of the optical axis OA1, over which the excited laser gas flows, is given by Equation (24) below:

$$g_{01} L_{p1} \approx 33 \tag{24}$$

The self-oscillation is caused by diffracted light or reflection from some component external to the first-stage gas laser amplifier 10D or the internal component such as the aperture 31, 32, or 33. For this reason, self-oscillating light provides a very low feedback rate, and, in most cases, an oscillation threshold for the self-oscillation is substantially the same as the small-signal gain. Thus, a condition that should be satisfied in order to cause the oscillation within the optical resonator 43 before the generation of the self-oscillating light is given by Inequality (25) below:

$$g_{01} L_{p1} > g_{r1} L_{r1} \tag{25}$$

Equations (19) and (24) give below Inequality (26) that is a condition which the reflectances $R_1$ and $R_2$ of the partially reflective mirrors 16 and 19 of the optical resonator 43 should satisfy:

$$R_1 R_2 > 48 \times 10^{-30} \tag{26}$$

Setting the product of the reflectance $R_1$ of the partially reflective mirror 16 and the reflectance $R_2$ of the partially reflective mirror 19 larger than $48 \times 10^{30}$ and smaller than $100 \times 10^{-6}$ on the basis of Inequalities (22) and (26) enables the above-described prevention of self-oscillation within the first-stage gas laser amplifier 10D.

Let $g_{p2}$ be a residual gain, that is to say, a gain per unit length during the amplification of the amplified laser beam entering the second-stage gas laser amplifier 10A on the optical axis OA1. An output of the amplified beam entering the second-stage gas laser amplifier 10A is represented by $P2_{in}$, and the output of the amplified beam exiting the second-stage gas laser amplifier 10A is represented by $P2_{out}$. The optical axis OA1 includes an optical path length $L_{p2}$ over which the excited laser gas in the second-stage gas laser amplifier 10A flows, and a gain for the seed laser beam to be amplified along the optical path length $I_{p2}$ of the optical axis OA1 is given by Equation (27) below:

[Formula 13]

$$g_{p2} L_{p2} = \ln\left(\frac{P2_{out}}{p2_{in}}\right) \tag{27}$$

Let the reflectances of the partially reflective mirror 16 and the totally reflective mirror 17 of the second-stage optical resonator 40 respectively be $R_3$ and $R_4$, and let the oscillation threshold gain $g_{r2}$ be a gain per unit length when the optical resonator 40 causes the oscillation. The optical axis OA2 includes an optical path length $L_{r2}$ over which the excited laser gas flows, and a gain for the laser beam generated within the optical resonator 40 to be amplified along the optical path length $L_{r2}$ of the optical axis OA2 is given by Equation (28) below:

[Formula 14]

$$g_{r2} L_{r2} = -\frac{1}{2} \ln R_3 R_4 \tag{28}$$

A condition that should be satisfied in order for the optical resonator 40 to automatically suspend the oscillation when the amplified beam enters the second-stage gas laser amplifier 10A is given by Inequality (29) below:

$$g_{p2} L_{p2} < g_{r2} L_{r2} \tag{29}$$

Equations (27) and (28) and Inequality (29) give below Inequality (30) that is a condition which the reflectances $R_1$ and $R_4$ of the partially reflective mirror 16 and the totally reflective mirror 17 of the optical resonator 40 should satisfy:

[Formula 15]

$$R_3 R_4 < \left(\frac{P2_{out}}{P2_{in}}\right)^{-2} \tag{30}$$

For example, the second-stage gas laser amplifier 10A assumed to output an amplified beam of 25 kW or more with respect to the input laser beam of 10 kW or less has an amplification factor of 2.5 or more. A condition of the reflectance $R_1$ of the partially reflective mirror 16 and the reflectance $R_4$ of the totally reflective mirror 17 is given by Inequality (31) below:

$$R_3R_4 < 160 \times 10^{-3} \qquad (31)$$

On the other hand, let beam intensity of the amplified beam entering the second-stage gas laser amplifier 10A be $I2_{in}$, let beam intensity of the amplified beam from the second-stage gas laser amplifier 10A be $I2_{out}$, let saturation intensity be $I_s$, and let the small-signal gain of the second-stage gas laser amplifier 10A be $g_{02}$. A small-signal gain along the optical path length $L_{p2}$ of the optical axis OA1, over which the excited laser gas flows, is given by Equation (32) below:

[Formula 16]

$$g_{02}L_{p2} = \ln\left(\frac{I2_{out}}{I2_{in}}\right) + \left(\frac{I2_{out}}{I_s} - \frac{I2_{in}}{I_s}\right) \qquad (32)$$

For example, assume that the saturation intensity $I_s$ is 200 W/cm$^2$ and that the above 10 kW laser beam is input, amplified in the second-stage gas laser amplifier 10A, and output as the 25 KW amplified seed laser beam having a beam diameter φ of 30 mm. Under such a condition, the small-signal gain along the optical path length $L_{p2}$ of the optical axis OA1, over which the excited laser gas flows, is given by Equation (33) below:

$$g_{02}L_{p2} \approx 11.5 \qquad (33)$$

The self-oscillation is caused by diffracted light or reflection from some component external to the second-stage gas laser amplifier 10A or the internal component such as the aperture 31. For this reason, self-oscillating light provides a very low feedback rate, and, in most cases, an oscillation threshold for the self-oscillation is substantially the same as the small-signal gain. Thus, a condition that should be satisfied in order to cause the oscillation within the optical resonator 40 before the generation of the self-oscillating light is given by Inequality (34) below:

$$g_{02}L_{p2} > g_{r2}L_{r2} \qquad (34)$$

Equations (28) and (33) give below Inequality (35) that is a condition which the reflectances $R_3$ and $R_4$ of the partially reflective mirror 16 and the totally reflective mirror 17 of the optical resonator 40 should satisfy:

$$R_3R_4 > 1 \times 10^{-10} \qquad (35)$$

Setting the product of the reflectance $R_3$ of the partially reflective mirror 16 and the reflectance $R_4$ of the totally reflective mirror 17 larger than $1 \times 10^{-10}$ and smaller than $160 \times 10^{-3}$ on the basis of Inequalities (31) and (35) enables the above-described prevention of self-oscillation within the second-stage gas laser amplifier 10A.

As described above, coupling two or more of the gas laser amplifiers 10D and 10A and appropriately setting the reflectances $R_1$ and $R_2$ of the partially reflective mirrors 16 and 19 of the optical resonator 43 in the gas laser amplifier 10D and the reflectances $R_3$ and $R_4$ of the partially reflective mirror 16 and the totally reflective mirror 17 of the optical resonator 40 in the gas laser amplifier 10A enable the oscillation threshold gain for the laser beam within each of the optical resonators 43 and 40 to be larger than the gain during the amplification of the seed laser beam, which enters from outside, and smaller than the threshold gain for the self-oscillation. Consequently, it becomes possible to prevent the self-oscillation without use of devices that vary losses from the optical resonators 43 and 40 over time.

While the gas laser apparatus 1 of FIG. 26 is configured to have the coupled gas laser amplifiers 10D and 10A according to the first and fourth embodiments, the embodiment is not limited to this. In one example, the gas laser amplifier to be coupled may be any of those from the first through sixth embodiments. Any number of the gas laser amplifiers may be coupled in the gas laser apparatus 1.

While each of the gas laser amplifiers 10D and 10A of the gas laser apparatus 1 in FIG. 26 has the single one of the optical resonator 43, 40 in the housing 11, the embodiment is not limited to this. In one example, the gas laser apparatus 1 may be configured to include a single optical resonator for a plurality of the housings 11.

The seventh embodiment can also provide the same effects as the first through sixth embodiments.

Eighth Embodiment

Figure 32:
FIG. 32 is a perspective view schematically illustrating a configuration example of a gas laser amplifier according to an eighth embodiment.

FIG. 32 is a perspective view schematically illustrating a configuration example of a gas laser amplifier according to the eighth embodiment. The housing 11 is not illustrated in FIG. 32. In FIG. 32, the housing 11 (not illustrated) has a height along Y-directions. A seed laser beam enters in a direction perpendicular to the Y-directions, that is to say, along Z-directions, and X-directions are perpendicular to the Z-directions.

The gas laser amplifier 10G includes the housing 11 (not illustrated) and the windows 12 and 13, at one side face of the housing 11. The seed laser beam from the laser beam source 2 enters the amplifier through the window 12. After being amplified inside the housing 11, the beam exits through the window 13.

The gas laser amplifier 10G includes optical components that form a first optical path OP1 and optical. components that form a second optical path OP2. The first optical path OP1, which takes the form of a square in an XZ plane, guides therealong the laser beam entering through the window 12. The second optical path OP2, which takes the form of a square in an XZ plane, guides therealong the laser beam from the first optical path OP1.

The optical components that form the first optical path OP1 include a pair of discharge tubes 68, a polarizing mirror 60, a pair of discharge tubes 69, a reflecting mirror 61, a pair of discharge tubes 70, a reflecting mirror 62, a pair of discharge tubes 71, and a reflecting mirror 63. The pair of discharge tubes 63 extends in the Z-direction. The pair of discharge tubes 69 extends in the X-direction. The pair of discharge tubes 70 extends in the Z-direction. The pair of discharge tubes 71 extends in the X-direction. The polarizing mirror 60 reflects a laser beam having the same polarization direction PD1 as the seed laser beam, and transmits a laser beam having the polarization direction PD2 orthogonal to the polarization direction PD1 of the seed laser beam.

The reflecting mirrors 61 and 62 reflect, in the X-directions, laser beams incident from the Z-directions. The reflecting mirrors 61 and 62 reflect, in the Z-directions, laser beams incident from the X-directions. The reflecting mirror 63 reflects, in the Y-direction, laser beams incident from the X-direction. The reflecting mirror 63 reflects, in the Y-direction, laser beams incident from the X-direction.

The optical components that form the second optical path OP2 include a reflecting mirror 64, a pair of discharge tubes 72, a reflecting mirror 65, a pair of discharge tubes 73, a reflecting mirror 66, a pair of discharge tubes 74, a polarizing mirror 67, and a pair of discharge tubes 75. The pair of discharge tubes 72 extends in the X-direction. The pair of discharge tubes 73 extends in the Z-direction. The pair of discharge tubes 74 extends in the X-direction. The pair of discharge tubes 75 extends in the Z-direction. The reflecting mirrors 65 and 66 reflect, in the X-directions, laser beams incident from the Z-directions. The reflecting mirrors 65 and 66 reflect, in the Z-directions, laser beams incident from the X-directions. The reflecting mirror 64 reflects, in the Y-direction, laser beams incident from the X-direction. The reflecting mirror 64 reflects, in the X-direction, laser beams incident from the Y-direction. The polarizing mirror 67 reflects a laser beam having the same polarization direction PD1 as the seed laser beam, and transmits a laser beam having the polarization direction PD2 orthogonal to the polarization direction PD1 of the seed laser beam.

A laser gas flows into the discharge tubes 68 to 75. The laser gas flows in directions D3. Each of the pairs of discharge tubes 68, 69, 70, 71, 72, 73, 74, or 75 is disposed on one side of the square-shaped optical path, and defines an interval therebetween at a midportion of the one side. The laser gases are supplied from the midportion into each of the pairs of discharge tubes 68, 69, 70, 71, 72, 73, 74, or 75, such that the least gases flow in the directions D3. The gas laser amplifier 10G further includes electrodes (not illustrated) about the discharge tubes 68 to 75, a high-frequency power supply (not illustrated) that supplies a high-frequency voltage to the electrodes, and blowers (not illustrated) that directs the laser gas. When the high-frequency voltage from the high-frequency power supply is applied to the electrodes with the discharge tubes 68 to 75 supplied with the laser gas, the laser gas in the discharge tubes 68 to 75 is excited.

The optical axis OA1 on which the seed laser beam is propagated inside the gas laser amplifier 10G is made up of the first optical path OP1 and the second optical path OP2.

The gas laser amplifier 10G further includes partially reflective mirrors 81 and 82 and dampers 83 and 84. Each of the partially reflective mirrors 81 and 82 reflects a portion of the laser beam and transmits the remaining portion of the laser beam. The partially reflective mirror 81 is disposed in such a position that the laser beam from the reflecting mirror 66 passes through the polarizing mirror 67. The damper 83 absorbs the laser beam having passed through the partially reflective mirror 81. The partially reflective mirror 82 is disposed in such a position that the laser beam from the reflecting mirror 61 passes through the polarizing mirror 60. The damper 84 absorbs the laser beam having passed through the partially reflective mirror 82.

The partially reflective mirrors 81 and 82 define an optical resonator. The optical axis OA2 of a laser beam oscillating within the optical resonator extends through the partially reflective mirror 81 and the polarizing mirror 67 to the reflecting mirror 66, and then to reflecting mirrors 65, 64, 63, 62, and 61 in that order, and extends through the polarizing mirror 60 and the partially reflective mirror 82.

A description is provided here of how the gas laser amplifier 10G operates. A description is provided first of the operation in the presence of the seed laser beam entering through the window 12. The seed laser beam emitted from the laser beam source 2, which is external to the gas laser amplifier 10G, enters the housing 11 through the window 12 along the optical axis OA1. The seed laser beam is a linearly polarized beam having the polarization direction PD1 and is reflected by the polarizing mirrors 60 and 67. The seed laser beam is amplified while being propagated through the discharge tubes 68 through which the excited laser gases flow. The amplified seed laser beam, that is to say, the amplified beam is reflected by the polarizing mirror 60 and enters the next discharge tubes 69. Thereafter, the amplified beam is amplified while being propagated to the reflecting mirror 61, the discharge tubes 70, the reflecting mirror 62, the discharge tubes 71, the reflecting mirror 63, the reflecting mirror 64, the discharge tubes 72, the reflecting mirror 65, the discharge tubes 73, the reflecting mirror 66, and the discharge tubes 74 in this order. The amplified beam is then reflected by the polarizing mirror 67, is amplified further by the discharge tubes 75, and exits through the window 13. In other words, what is illustrated in FIG. 32 is a fast axial flow laser amplifier in which the laser gas flows in the directions D3 that are a direction of propagation of the laser beam.

In FIG. 32, the laser gases from the midportion of each side of the square-shaped optical path flow through the discharge tubes 63, 69, 70, 71, 72, 73, 74, 75 toward ends where the polarizing mirrors 60, 67 or the reflecting mirror 61, 62, 63, 64, 65, 66 are disposed. However, the laser gases may flow from the ends of the individual sides of the square-shaped optical path where the polarizing mirror 60, 67 or the reflecting mirrors 61, 62, 63, 64, 65, 66 are disposed, toward the midportions through the discharge tubes 68, 69, 70, 71, 72, 73, 74, 75. The laser gas flows are generated by the blowers that are not illustrated.

A description is provided next of the operation during no entrance of the seed laser beam through the window 12. When the seed laser beam does not enter, a beam generated from the laser gas excited by electric discharge is propagated through the discharge tubes along the optical axis OA2. In this case, a component having the polarization direction PD2 orthogonal to the polarization direction PD1 of the seed laser beam passes through the polarizing mirrors 60 and 67 and thus is reflected by the partially reflective mirrors 81 and 82. This means that the optical resonator is defined between the partially reflective mirrors 81 and 82. The laser beam, which is reflected by the partially reflective mirrors 31 and 82, is reciprocatively propagated through the excited laser gas, experiencing laser oscillation. The laser beam oscillating between the partially reflective mirrors 81 and 82 partly passes through the partially reflective mirrors 81 and 82 and is absorbed by the dampers 83 and 84. Since the laser beam oscillating between the partially reflective mirrors 81 and 82 has the polarization direction PD2 orthogonal to the polarization direction PD1 of the seed laser beam, as described above and is not reflected by the polarizing mirrors 60 and 67, this laser beam never exits the gas laser amplifier 10G through the windows 12 and 13.

While the polarization direction PD1 of the seed laser beam is the Y-directions in FIG. 32, the polarization direction PD1 may be the X-directions. In that case, the polarization direction PD2 of the laser beam that oscillates within the optical resonator is the Y-directions that are 90° away from that of the seed laser beam.

In the gas laser amplifier 10G according to the eighth embodiment, either the seed laser beam or the laser beam from the optical resonator always exists and consumes gain within the gas laser amplifier 10G. As a result, no unintended self-oscillation occurs in the gas laser amplifier 10G, resulting in no emission of beams other than the amplified seed laser beam from the gas laser amplifier 10G.

Ninth Embodiment

Figure 33:
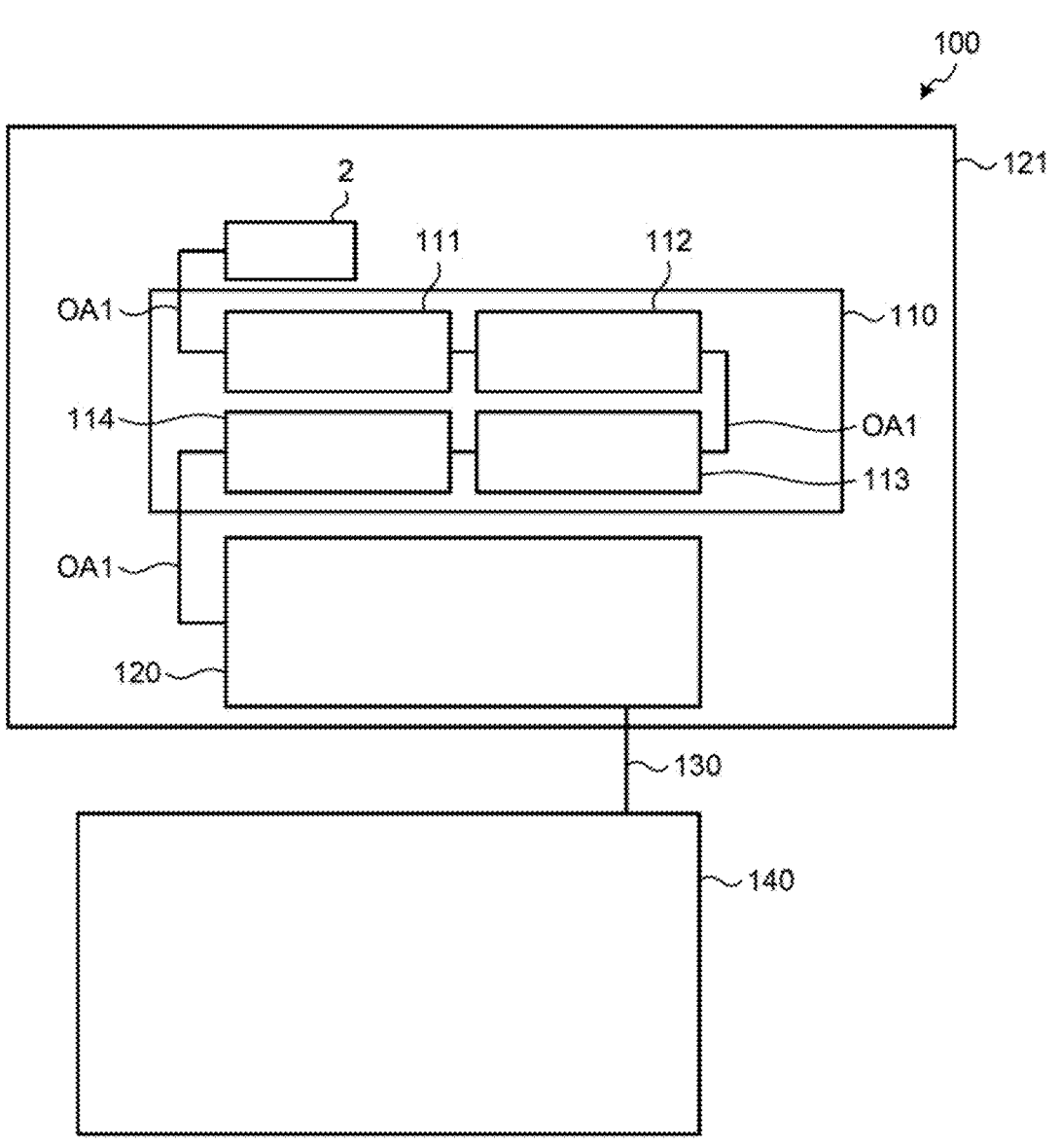
FIG. 33 is a block diagram schematically illustrating a configuration example of an EUV exposure apparatus according to a ninth embodiment.

FIG. 33 is a block diagram schematically illustrating a configuration example of an EUV exposure apparatus according to the ninth embodiment. The EUV exposure apparatus 100 includes the laser beam source 2, a laser amplification unit 110, an EUV light generation unit 120, and an exposure unit 140.

The laser beam source 2 includes a laser oscillator that produces a seed laser beam. The laser amplification unit 110 includes one or more gas laser amplifiers. The gas laser amplifiers in the laser amplification unit 110 include one or more of the gas laser amplifiers 10A to 10G described in the first, second, third, fourth, fifth, sixth, and eighth embodiments. In the example of FIG. 33, the laser amplification unit 110 includes the four gas laser amplifiers 111, 112, 113, and 114, which are connected in series along the optical axis OA1. In the example of FIG. 33, the four gas laser amplifiers 111 to 114 are connected in series in the laser amplification unit 110; however, the gas laser amplifiers 111 to 114 in the laser amplification unit 110 are not limited to four in number, provided that the number of gas laser amplifiers is one or more.

The EUV light generation unit 120 irradiates a falling tin (Sn) droplet with a pulsed laser beam from the laser amplification unit 110 to generate EUV light. The generated EUV light enters the exposure unit 140 along a transmitting optical path 130.

The exposure unit 140 irradiates, for example, a resist applied to a substrate such as a semiconductor substrate with the EUV light via a photomask with a predetermined pattern, thus exposing the resist. The exposure unit 140 includes a substrate stage (not illustrated) that holds the substrate, and a photomask stage (not illustrated) that holds the photomask. The exposure unit 140 further includes an illumination optical system (not illustrated) that adjusts an EUV light irradiation area on the photomask, and a projection optical system (not illustrated) that reduces and projects, onto the substrate, the EUV light reflected by the photomask.

The laser beam source 2 and the laser amplification unit 110 make up the gas laser apparatus 1. This means that the gas laser apparatus 1 includes the one or more of the gas laser amplifiers 10A to 10G described in the first, second, third, fourth, fifth, sixth, and eighth embodiments. The laser beam source 2, the laser amplification unit 110, and the EUV light generation unit 120 make up an EUV light generation apparatus 121. This means that the EUV light generation apparatus 121 includes the one or more of the gas laser amplifiers 10A to 10G described in the first, second, third, fourth, fifth, sixth, and eighth embodiments.

A description is provided of how the EUV exposure apparatus 100 operates. A seed laser beam emitted from the laser beam source 2 enters the laser amplification unit 110 along the optical axis OA1. The seed laser beam enters the gas laser amplifier 111 of the laser amplification unit 110 to be amplified and exits the gas laser amplifier 111 as an amplified beam. After exiting, the amplified beam is similarly amplified in and emitted from each of the gas laser amplifiers 112 to 114. The beam amplified by the laser amplification unit 110 enters the EUV light generation unit 120. In the EUV light generation unit 120, the laser beam is focused, for irradiation, onto tin targets that fall as droplets in a predetermined cycle. As each of the tin targets is irradiated with the laser beam, EUV light is generated from tin. The generated EUV light is guided to the exposure unit 140 along the transmitting optical path 130. The exposure unit 140 irradiates the resist, which is applied to the substrate, with the EUV light, which has been reflected by the photomask, thus exposing the resist.

Since the EUV exposure apparatus 100 according to the ninth embodiment includes any of the gas laser amplifiers 10A to 10G according to the first, second, third, fourth, fifth, sixth, and eighth embodiments, no self-oscillating light is generated when the seed laser beam does not enter the gas laser amplifier 10A, 10B, 10C, 10D, 10E, 10F, or 10G. Moreover, a laser beam that experiences laser oscillation within the optical resonator of the gas laser amplifier 10A, 10B, 10C, 10D, 10E, 10F, or 10G never exits the gas laser amplifier 10A, 10B, 10C, 10D, 10E, 10F, or 10G. Therefore, the target in the EUV light generation unit 120 or the laser beam source 2 of the seed laser beam is never irradiated with self-oscillating light nor the laser beam that has oscillated within the optical resonator. Consequently, the EUV exposure apparatus 100 and the EUV light generation apparatus 121 are capable of preventing some problem that might result from unintended irradiation with the laser beam.

The above configurations illustrated in the embodiments are illustrative of contents of the present. invention, can be combined with other techniques that are publicly known, and can be partly omitted or changed without departing from the gist of the present invention.

REFERENCE SIGNS LIST 1 gas laser apparatus; 2 laser beam source; 10A, 10B, 10C, 10D, 10E, 10F, 10G, 111, 112, 113, 114 gas laser amplifier; 11 housing; 11A, 11B side face; 12, 13 window; 14, 15, 60, 67 polarizing mirror; 16, 19, 81, 82 partially reflective mirror; 17 totally reflective mirror; 18, 57a, 57b, 83, 84 damper; 20A, 20B discharge electrode pair; 21A, 22A, 21B, 22B discharge electrode; 23A, 23B discharge space; 25A, 25B gas flow generation unit; 31, 32, 33 aperture; 40, 41, 42, 43 optical resonator; 51, 52, 53, 54, 61, 62, 63, 64, 65, 66 reflecting mirror; 56 beam splitter; 68, 69, 70, 71, 72, 73, 74, 75 discharge tube; 100 EUV exposure apparatus; 110 laser amplification unit; 120 EUV light generation unit; 121 EUV light generation apparatus; 130 transmitting optical path; 140 exposure unit; OA1, OA2 optical axis.

The invention claimed is:

1. A gas laser amplifier comprising:
a housing including an entrance window to allow entry of a first laser beam from outside and an exit window to allow exit of the first laser beam amplified;
a discharge electrode pair to excite a laser gas supplied between discharge electrodes facing each other in the housing; and
an optical resonator to cause a second laser beam to oscillate with a gain of the excited laser gas in a non-incident state where the first laser beam from outside the housing does not enter the housing through the entrance window, and suspend the oscillation of the second laser beam in an incident state where the first laser beam enters the housing through the entrance window, wherein
the optical resonator has an oscillation threshold gain ($g_r$) smaller than an oscillation threshold gain ($g_s$) for self-oscillation and larger than a gain ($g_p$) during amplification of the first laser beam such that the second laser beam oscillates before the self-oscillation occurs in the non-incident state, and the optical resonator includes a partially reflective mirror to reflect a portion of the second laser beam and transmit a remaining portion of the second laser beam, a totally reflective mirror to reflect the second laser beam, and a first damper to absorb the second laser beam having passed through the partially reflective mirror.

2. The gas laser amplifier according to claim 1, wherein the first laser beam is a linearly polarized beam polarized to a first direction, and the second laser beam is a linearly polarized beam polarized to a second direction orthogonal to the first direction.

3. The gas laser amplifier according to claim 1, wherein the partially reflective mirror has a reflectance larger than $7 \times 10^{-21}$ and smaller than $16 \times 10^{-6}$.

4. A gas laser amplifier comprising:

a housing including an entrance window to allow entry of a first laser beam from outside and an exit window to allow exit of the first laser beam amplified;

a discharge electrode pair to excite a laser gas supplied between discharge electrodes facing each other in the housing; and an optical resonator to cause a second laser beam to oscillate with a gain of the excited laser gas in a non-incident state where the first laser beam from outside the housing does not enter the housing through the entrance window, and suspend the oscillation of the second laser beam in an incident state where the first laser beam enters the housing through the entrance window, wherein the optical resonator includes a first partially reflective mirror to reflect a portion of the second laser beam and transmit a remaining portion of the second laser beam, a second partially reflective mirror to reflect a portion of the second laser beam and transmit a remaining portion of the second laser beam, a first damper to absorb the remaining portion of the second laser beam having passed through the first partially reflective mirror, and a second damper to absorb the remaining portion of the second laser beam having passed through the second partially reflective mirror.

5. The gas laser amplifier according to claim 4, wherein a product of a reflectance of the first partially reflective mirror and a reflectance of the second partially reflective mirror is larger than $7 \times 10^{-21}$ and smaller than $16 \times 10^{-6}$.

6. The gas laser amplifier according to claim 4, wherein the optical resonator further includes a beam splitter disposed on an optical path of the optical resonator, and a third damper to absorb the second laser beam that is to be separated by the beam splitter.

7. The gas laser amplifier according to claim 6, wherein a product of a reflectance of the first partially reflective mirror, a reflectance of the second partially reflective mirror, and a square of a transmittance of the beam splitter is larger than $7 \times 10^{-21}$ and smaller than $16 \times 10^{-6}$.

8. The gas laser amplifier according to claim 1, further comprising a reflecting mirror in the housing to reflect the first laser beam, wherein an optical axis of the first laser beam is turned around by the reflecting mirror between the entrance window and the exit window in the housing.

9. The gas laser amplifier according to claim 1, wherein an optical axis of the second laser beam overlaps a portion of an optical axis of the first laser beam that passes through the entrance window and the exit window.

10. The gas laser amplifier according to claim 1, further comprising a gas flow generation unit to cause the laser gas to flow in a direction of an optical axis of the first laser beam, in an area including a space between the discharge electrodes.

11. The gas laser amplifier according to claim 1, wherein an optical axis of the second laser beam and an optical axis of the first laser beam that passes through the entrance window and the exit window are independent of each other.

12. The gas laser amplifier according to claim 11, wherein the optical resonator is disposed such that an optical axis of the second laser beam partly intersects an optical axis of the first laser beam.

13. The gas laser amplifier according to claim 1, further comprising gas flow generation units each to cause the laser gas to flow toward an area including a space between the discharge electrodes, wherein the laser gas is two in number, and the gas flow generation units cause the two laser gases to flow in third directions at different positions, the third directions being perpendicular to first and second directions, the first direction being a direction of entry of the first laser beam, the second direction being a direction of a gap between the discharge electrode pair, the different positions being separate from each other in the first direction, and directions of the two laser gas flows are opposite to each other.

14. A gas laser amplifier comprising:

a housing including an entrance window to allow entry of a first laser beam from outside and an exit window to allow exit of the first laser beam amplified;

a discharge electrode pair to excite a laser gas supplied between discharge electrodes facing each other in the housing; and an optical resonator to cause a second laser beam to oscillate with a gain of the excited laser gas in a non-incident state where the first laser beam from outside the housing does not enter the housing through the entrance window, and suspend the oscillation of the second laser beam in an incident state where the first laser beam enters the housing through the entrance window, wherein an optical axis of the second laser beam and an optical axis of the first laser beam that passes through the entrance window and the exit window are independent of each other, the optical resonator is disposed such that an optical axis of the second laser beam partly intersects an optical axis of the first laser beam, and the laser gas is two in number, and the gas amplifier further comprising gas flow generation units to cause the two laser gases to flow in third directions at different position, the third directions being perpendicular to first and second directions, the first direction being a direction of entry of the first laser beam, the second direction being a direction of a gap between the discharge electrode pair, the different positions being separate from each other in the first direction, wherein directions of the two laser gases are opposite to each other, and an optical axis of the second laser beam partly extends on an upstream side of an optical axis of the first laser beam, in directions of flows of the laser gases.

15. The gas laser amplifier according to claim 1, wherein the first laser beam is a pulsed laser beam.

16. A gas laser apparatus comprising:

a laser amplification unit including one or more gas laser amplifiers according to claim 1; and a laser beam source to emit the first laser beam, the laser beam source being external to housings of the gas laser amplifiers.

17. An EUV light generation apparatus comprising the gas laser apparatus according to claim 16.

18. An EUV exposure apparatus comprising the gas laser apparatus according to claim 16.

* * * * *